United States Patent
Takai et al.

(10) Patent No.: US 11,123,774 B2
(45) Date of Patent: Sep. 21, 2021

(54) SUBSTRATE PROCESSING METHOD, SUBSTRATE PROCESSING APPARATUS, AND COMPOSITE PROCESSING APPARATUS

(71) Applicant: TOSHIBA MEMORY CORPORATION, Tokyo (JP)

(72) Inventors: Kosuke Takai, Kanagawa (JP); Mana Tanabe, Kanagawa (JP); Hideaki Sakurai, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 168 days.

(21) Appl. No.: 16/296,573

(22) Filed: Mar. 8, 2019

(65) Prior Publication Data

US 2020/0078833 A1 Mar. 12, 2020

(30) Foreign Application Priority Data

Sep. 6, 2018 (JP) .............................. JP2018-167154

(51) Int. Cl.
| | |
|---|---|
| B08B 7/00 | (2006.01) |
| H01L 21/67 | (2006.01) |
| H01L 21/02 | (2006.01) |
| B08B 3/10 | (2006.01) |

(52) U.S. Cl.
CPC .............. *B08B 7/0092* (2013.01); *B08B 3/10* (2013.01); *H01L 21/02057* (2013.01); *H01L 21/6715* (2013.01); *H01L 21/67051* (2013.01); *H01L 21/67109* (2013.01); *H01L 21/67248* (2013.01); *H01L 21/67253* (2013.01)

(58) Field of Classification Search
CPC ......... H01L 21/02057; H01L 21/67051; H01L 21/6715; H01L 21/67248; H01L 21/67253
See application file for complete search history.

(56) References Cited

U.S. PATENT DOCUMENTS

2018/0047559 A1 2/2018 Kamiya et al.

FOREIGN PATENT DOCUMENTS

| JP | 5639429 B | 12/2014 |
|---|---|---|
| JP | 2016-70669 A | 5/2016 |
| JP | 2018-26436 A | 2/2018 |

*Primary Examiner* — Spencer E. Bell
(74) *Attorney, Agent, or Firm* — Finnegan, Henderson, Farabow, Garrett & Dunner, L.L.P.

(57) ABSTRACT

According to one embodiment, a substrate processing method includes supplying a liquid on a first face of a substrate, forming a solidified layer in which at least part of the liquid has been solidified by cooling the substrate down to be equal to or lower than a solidification point of the liquid, and melting the solidified layer. Forming the solidified layer, includes controlling a cooling parameter by monitoring an optical characteristic or acoustic wave characteristic of the solidified layer.

5 Claims, 19 Drawing Sheets

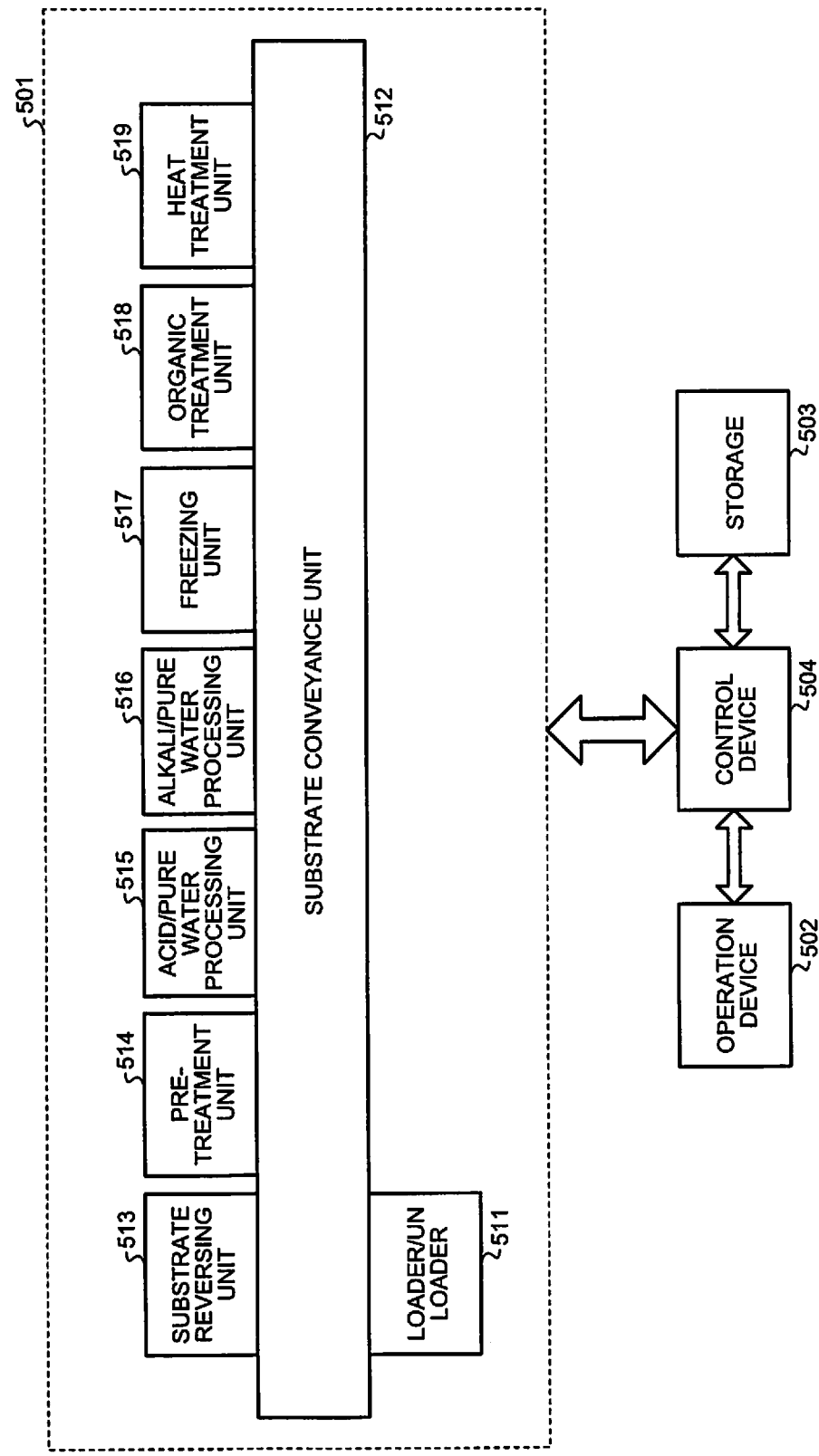

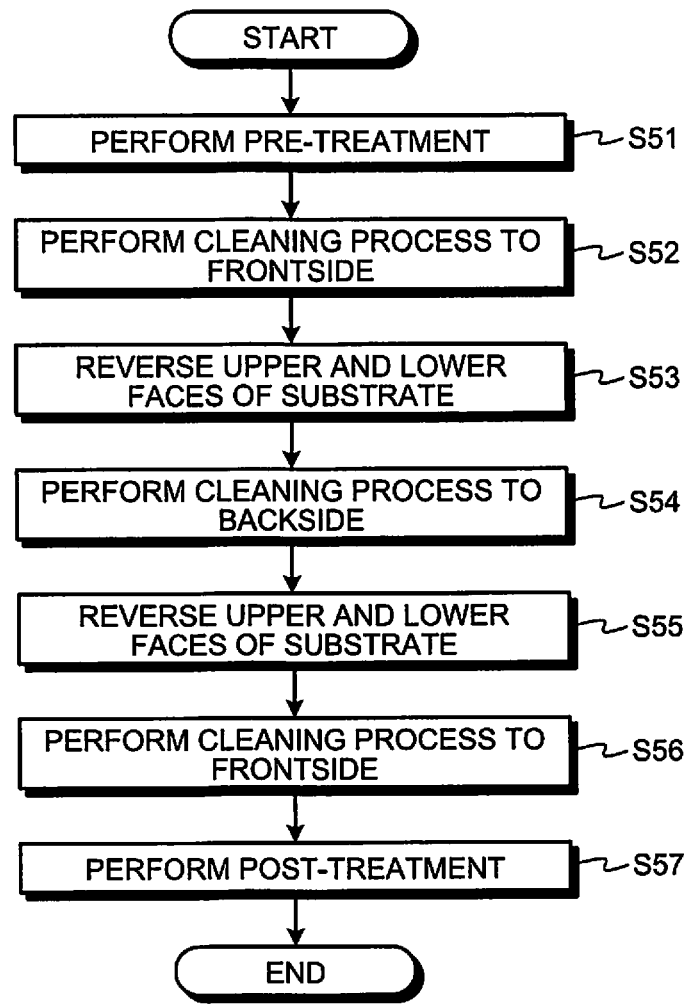

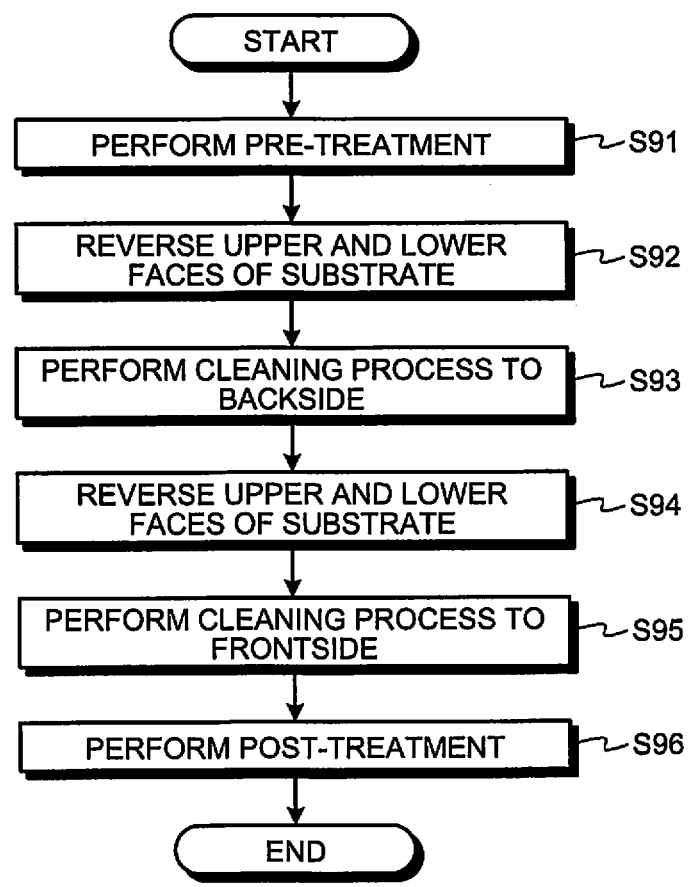

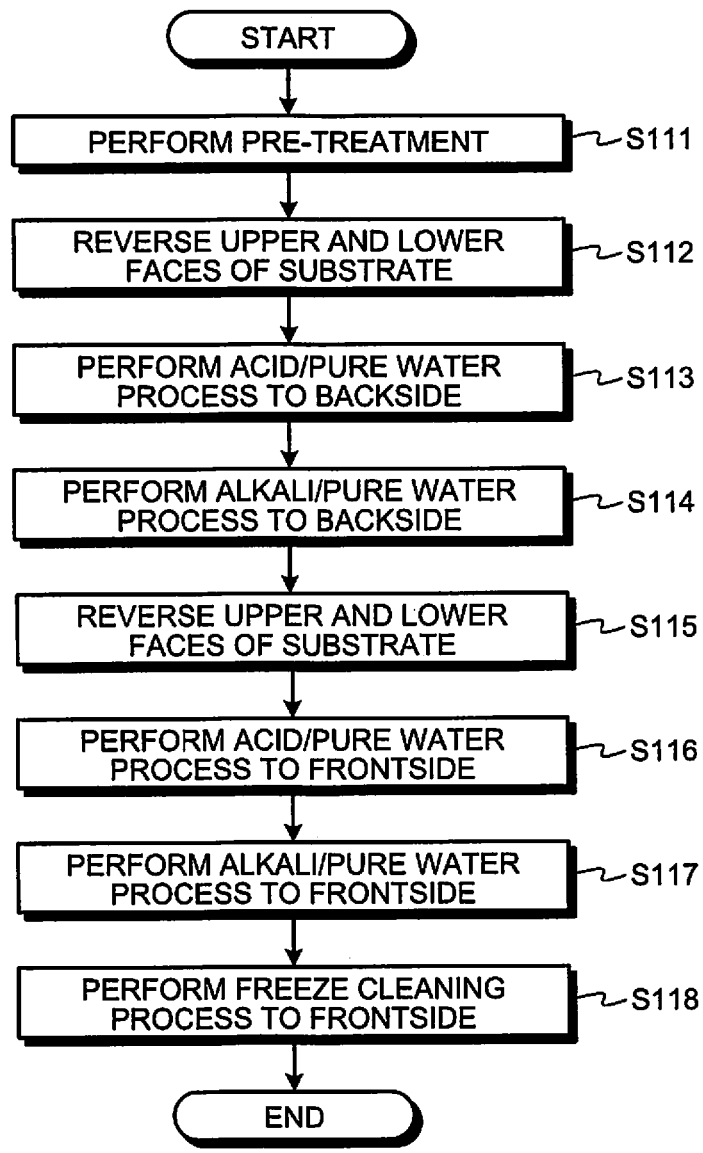

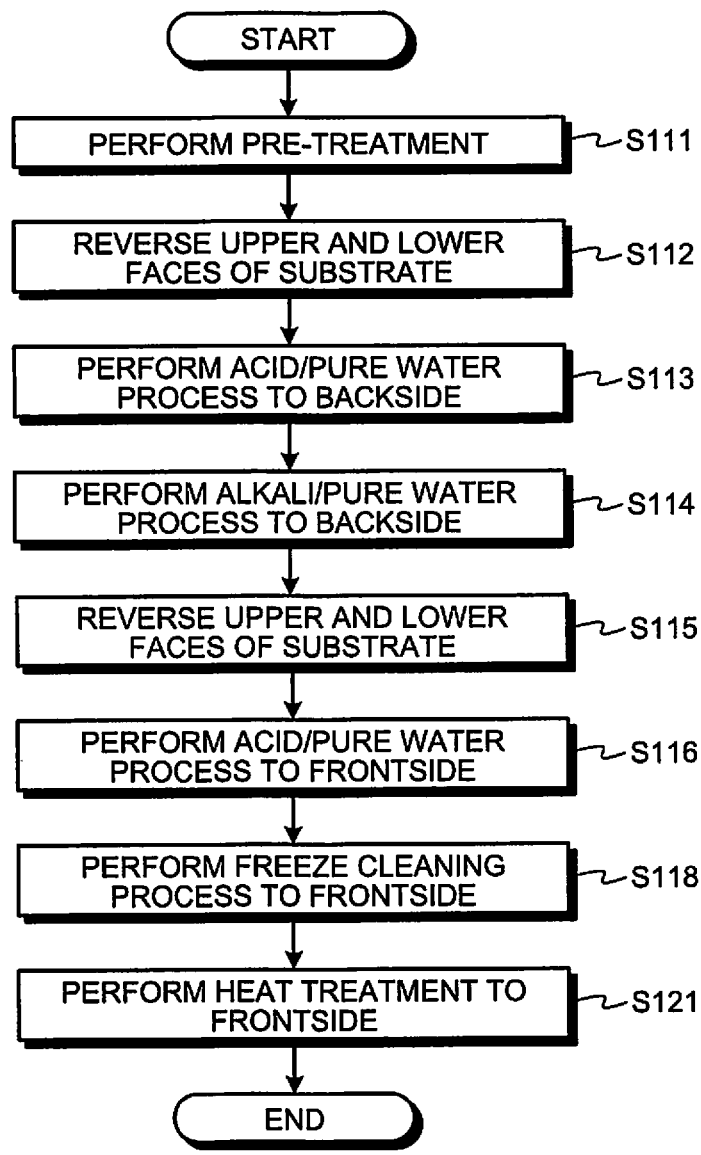

_US 11,123,774 B2_

SUBSTRATE PROCESSING METHOD, SUBSTRATE PROCESSING APPARATUS, AND COMPOSITE PROCESSING APPARATUS

CROSS-REFERENCE TO RELATED APPLICATIONS

This application is based upon and claims the benefit of priority from Japanese Patent Application No. 2018-167154, filed on Sep. 6, 2018; the entire contents of which are incorporated herein by reference.

FIELD

Embodiments described herein relate generally to a substrate processing method, a substrate processing apparatus, and a composite processing apparatus.

BACKGROUND

Conventionally, a cleaning technique is known, which brings a cooling medium into contact with the backside of a template to freeze a liquid supplied on the frontside of the template and thereby to form a frozen layer, and then removes the frozen layer to remove foreign substances from the frontside of the template.

However, in this conventional technique, there is a case where the frozen layer causes brittle fracture while the liquid is being frozen. In a case where the template includes a pattern arranged on the frontside, there is a risk that the pattern could be collapsed by the brittle fracture.

BRIEF DESCRIPTION OF THE DRAWINGS

FIG. 14 is a diagram schematically illustrating a configuration example of a substrate processing system according to a fourth embodiment;

FIG. 16 is a flowchart illustrating an example of an outline of the sequence of a substrate processing method according to the fourth embodiment, in a case where there is a risk that a pattern arrangement face could be contaminated;

FIG. 19 is a flowchart illustrating an example of an outline of the sequence of a substrate processing method according to the fourth embodiment, in a case where there is no risk that the pattern arrangement face could be contaminated;

FIG. 20 is a flowchart illustrating an example of the processing sequence of a substrate processing method according to the fourth embodiment, in a case where there is no risk that the pattern arrangement face could be contaminated; and FIG. 21 is a flowchart illustrating another example of the processing sequence of a substrate processing method according to the fourth embodiment, in a case where there is no risk that the pattern arrangement face could be contaminated.

DETAILED DESCRIPTION

In general, according to one embodiment, a substrate processing method includes supplying a liquid on a first face of a substrate, forming a solidified layer in which at least part of the liquid has been solidified by cooling the substrate down to be equal to or lower than a solidification point of the liquid, and melting the solidified layer. Forming the solidified layer includes, controlling cooling parameter by monitoring an optical characteristic or acoustic wave characteristic of the solidified layer.

Exemplary embodiments of a substrate processing method, a substrate processing apparatus, and a composite processing apparatus will be explained below in detail with reference to the accompanying drawings. The present invention is not limited to the following embodiments.

First Embodiment

Figure 1A:
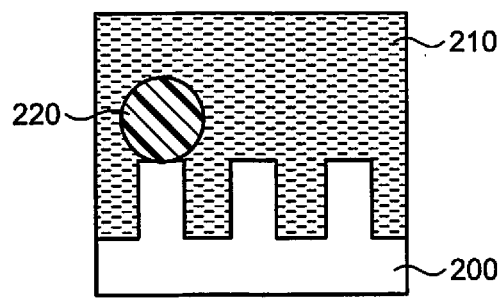
FIGS. 1A to 1C are diagrams illustrating an example of processing procedures of freeze cleaning.
Figure 1B:
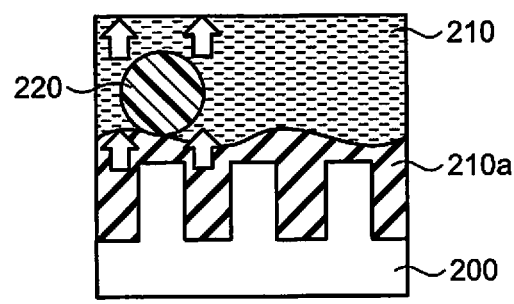
Figure 1C:
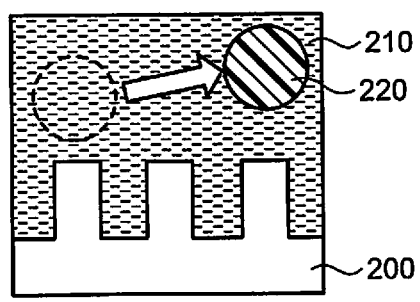

FIGS. 1A to 1C are diagrams illustrating an example of processing procedures of freeze cleaning. Here, it is assumed that foreign substances (particles) 220 are attaching to a face with a pattern arranged thereon of a substrate 200 serving as an object of a cleaning process. The substrate 200 is a template to be used for imprint processing, a photomask to be used in a light exposure apparatus, a blank substrate without any pattern arranged thereon, or the like. Further, as the foreign substances 220, there are organic foreign substances and/or inorganic foreign substances. Here, in the following description, about the substrate 200 being subjected to a cleaning process, the face oriented upward will be referred to as "upper face", and the face oriented downward will be referred to as "lower face". Further, in the substrate 200, the face with a pattern arranged thereon will be referred to as "frontside", and the face opposite to the frontside will be referred to as "backside". When the substrate 200 is placed in an apparatus in a state where the frontside is on the upper side, the upper face of the substrate 200 is the frontside. On the other hand, when the substrate 200 is placed in an apparatus in a state where the frontside is on the lower side, the upper face of the substrate 200 is the backside. FIGS. 1A to 1C illustrate a state where the frontside of the substrate 200 is the upper face.

As illustrated in FIG. 1A, a processing liquid is supplied onto the upper face of the substrate 200 with the foreign substances 220 attaching thereto, and a processing liquid 210 is thereby formed. Then, as illustrated in FIG. 1B, a cooling liquid or cooled gas, which has a temperature lower than the solidification temperature of the processing liquid, is supplied onto the lower face of the substrate 200, and the processing liquid 210 is thereby frozen (solidified). Consequently, a frozen layer 210a that is a solidified layer is formed from the substrate 200 side of the processing liquid 210. Since the processing liquid 210 expands its volume when being frozen, the foreign substances 220 attaching to the upper face of the substrate 200 are lifted toward the side separating from the upper face of the substrate 200, during formation of the frozen layer 210a. Then, in this state, as illustrated in FIG. 1C, for example, a processing liquid is supplied to thaw (melt) the frozen layer 210a, and to perform a rinsing process. Consequently, the foreign substances 220 lifted from the upper face of the substrate 200 are washed out by the processing liquid, and thus the foreign substances 220 are removed. The above-described process of removing the foreign substances by utilizing freezing will be referred to as "freeze cleaning".

Figure 2:
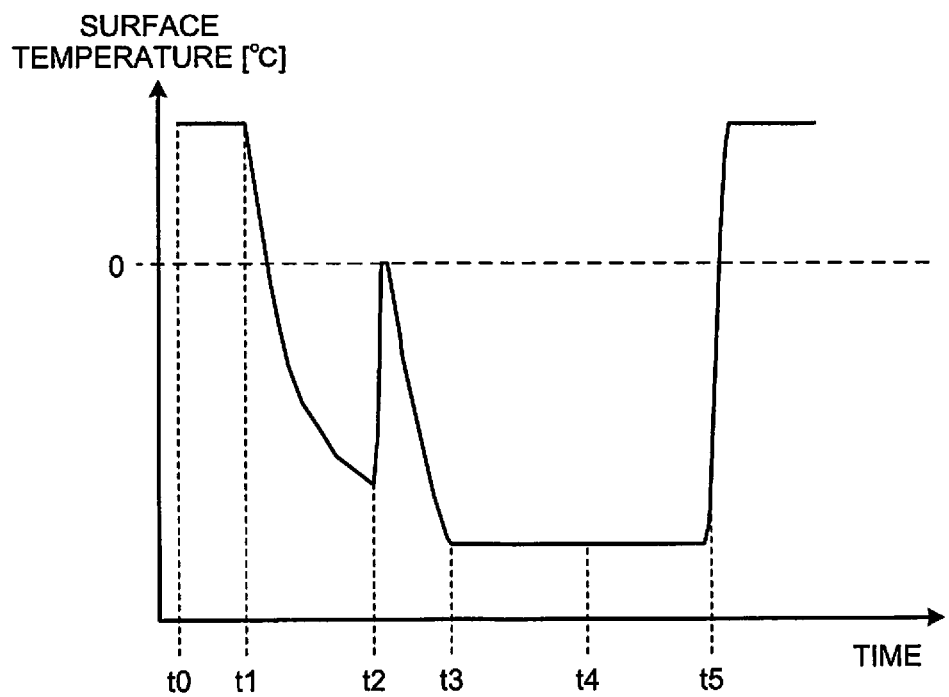
FIG. 2 is a diagram illustrating a change in substrate temperature with time during freeze cleaning according to a comparative example.

FIG. 2 is a diagram illustrating a change in substrate temperature with time during freeze cleaning according to a comparative example. In FIG. 2, the horizontal axis indicates the time, and the vertical axis indicates the substrate temperature. As illustrated in FIG. 2, at a time point t0, supply of a processing liquid onto the upper face of a substrate 200 is started, and cooling to the substrate 200 by a cooling medium is also started. For example, pure water at 25° C. is used as the processing liquid, and nitrogen gas cooled to −120° C. is used as the cooling medium.

At a time point t1, supply of the processing liquid is stopped, and, in a state where the upper face of the substrate 200 is filled with the processing liquid that is pure water, the temperature of the pure water undergoes falling from room temperature. Further, as the cooling is continued, the pure water passes through a super-cooled state lower than the solidification point (0° C.), and is frozen into ice at a certain timing t2. In other words, a frozen layer 210a is formed. At this time, the temperature of the frozen layer 210a on the upper face of the substrate 200 once goes up to 0° C. However, then, the temperature further falls by subsequent cooling, and comes to be closer to the measurement lower limit of a radiation thermometer. Then, at a time point t3, the temperature reaches the measurement lower limit of the radiation thermometer, and thus the temperature cannot be measured any more by the radiation thermometer thereafter.

During this period, the frozen layer 210a keeps changing the state with time, such that its ice transparency changes from the state immediately after freeze-up. Further, as the cooling is continued, the frozen layer 210a causes brittle fracture (cracks) at a time point t4. In the comparative example, supply of the processing liquid is restarted after a lapse of a predetermined time since the time point to, and this restart timing is assumed to be at a time point t5. Here, at the time point t5, supply of the cooling medium is stopped. Consequently, the frozen layer 210a is melted, and the surface temperature returns to room temperature.

As described above, during the time points t3 to t5 in which the substrate 200 is at a temperature equal to or lower than the measurement limit of the radiation thermometer, a change caused by temperature cannot be measured for the state of the frozen layer 210a. In consideration of this, an explanation will be given of a substrate processing apparatus and a substrate processing method that can monitor a change in the state of the frozen layer 210a in a case where the substrate 200 is at a temperature equal to or lower than the measurement limit of the radiation thermometer.

Figure 3:
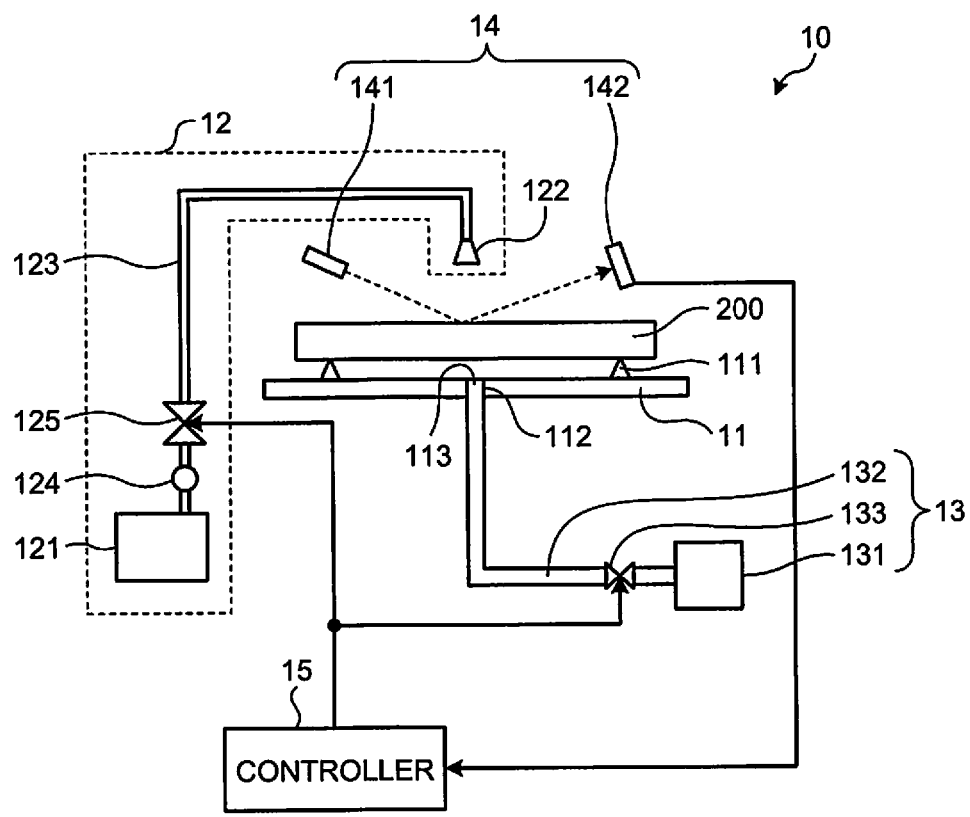
FIG. 3 is a diagram schematically illustrating a configuration example of a substrate processing apparatus according to a first embodiment.

FIG. 3 is a diagram schematically illustrating a configuration example of a substrate processing apparatus according to a first embodiment. The substrate processing apparatus 10 according to the first embodiment includes a stage 11, a liquid supply section 12, a cooling medium supply section 13, a monitoring section 14, and a controller 15.

The stage 11 is a member for holding the substrate 200 serving as a processing object of the freeze cleaning. The stage 11 corresponds to a substrate holding member. The stage 11 is provided with support portions 111 for supporting the substrate 200 at a position higher than the upper surface of the stage 11. The support portions 111 are configured to support the substrate 200 to be separated from the upper surface of the stage 11, so as to enable a cooling medium described later to come into contact with the lower face of the substrate 200 entirely. Further, the stage 11 is provided with a through hole 112, which penetrates the stage 11 in the vertical direction, at about the center in the horizontal direction. The portion of the through hole 112 that intersects with the upper surface of the stage 11 serves as a supply port 113 for the cooling medium, as described later. Here, the stage 11 may be configured to be rotatable about an axis, as the center, which extends through the center of the substrate mounting place and is perpendicular to the substrate mounting plane. In this case, each of the support portions 111 is equipped with a stopper that prevents the substrate 200 from shifting in the horizontal direction by the rotation of the stage 11.

The liquid supply section 12 is configured to supply a processing liquid to be used for the freeze cleaning. The liquid supply section 12 includes a processing liquid storage part 121 for storing the processing liquid, a nozzle 122 for dropping the processing liquid onto the upper face of the substrate 200, a pipe 123 connecting the nozzle 122 to the processing liquid storage part 121, a pump 124 for sending the processing liquid from the processing liquid storage part 121 through the pipe 123 to the nozzle 122, and a valve 125 for switching supply of the processing liquid from the processing liquid storage part 121 to the nozzle 122.

The cooling medium supply section 13 is configured to supply a cooling medium to cool the substrate 200 down to be equal to or lower than the solidification point of the processing liquid, in the freeze cleaning. The cooling medium supply section 13 includes a cooling medium storage part 131 for storing the cooling medium, a pipe 132 connecting the cooling medium storage part 131 to the through hole 112 of the stage 11, and a valve 133 for switching supply of the cooling medium. As the cooling medium, a gas, such as nitrogen gas, cooled to a temperature lower than the solidification point of the processing liquid, or a similarly cold liquid, such as liquid nitrogen or liquid chlorofluorocarbon, may be used. The end of the pipe 132 on the side connected to the through hole 112 serves as the supply port 113 for the cooling medium. The cooling medium supply section 13 corresponds to a solidifying part.

The monitoring section 14 is configured to monitor a change in the state of a processing liquid 210 formed by dropping the processing liquid onto the substrate 200. For example, this monitoring is performed for a state change of the processing liquid 210 that is being frozen and turned into a frozen layer 210a, and a state change of the frozen layer 210a occurring between before and after generation of cracks therein, or the like. In the first embodiment, the monitoring section 14 includes a light source 141 and a light receiving part 142. The light source 141 irradiates the processing liquid 210 or frozen layer 210a with light having a predetermined wavelength. The light receiving part 142 obtains an intensity of light reflected by the processing liquid 210 or frozen layer 210a (this light will be referred to as "reflected light", hereinafter), after light is emitted from the light source 141. The light source 141 is arranged to cause light to be incident with a predetermined angle to a predetermined point on the substrate 200. The light receiving part 142 is arranged to detect reflected light that has been reflected by the predetermined point on the substrate 200. The light receiving part 142 outputs detection results to the controller 15. The monitoring section corresponds to a monitor.

The controller 15 is configured to control the operations of the substrate processing apparatus 10 as a whole. In the first embodiment, particularly, the controller 15 determines whether a present state is a state where cracks of the frozen layer 210a are likely to be generated using light intensity reported from the monitoring section 14. When cracks are likely to be generated, the controller 15 controls the substrate processing apparatus 10 by changing a processing parameter. For example, the processing parameter may be exemplified by the supply time of the cooling medium until the start of melting to the frozen layer 210a, the flow rate of the cooling medium, the temperature of the cooling medium, and/or the like.

In the controller 15, there is a recipe that prescribes the processing time of from the start of supply of the cooling medium from the cooling medium supply section 13 until the stop of supply of the cooling medium. In the first embodiment, when light intensity reported from the monitoring section 14 satisfies a condition of crack generation, the controller 15 performs control to forcibly stop supply of the cooling medium even before the time to stop supply of the cooling medium, and to instruct the liquid supply section 12 to supply the processing liquid.

Alternatively, the controller 15 reduces the flow rate of the cooling medium or increases the temperature of the cooling medium, so as not to change the time until the stop of supply of the cooling medium prescribed in the recipe. In this way, the controller 15 performs control to reduce the cooling rate of the frozen layer 210a.

Figure 4:
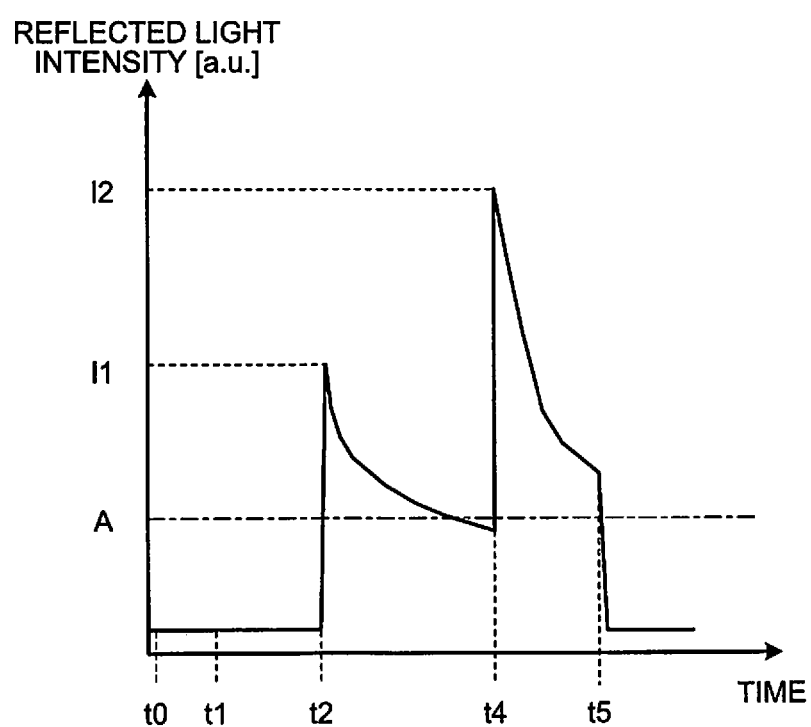
FIG. 4 is a diagram illustrating an example of a change in reflected light intensity with time, obtained from a processing liquid or frozen layer in a freezing process.

Next, an explanation will be given of a method of pre-detecting crack generation by using the controller 15. FIG. 4 is a diagram illustrating an example of a change in reflected light intensity with time, obtained from the processing liquid or frozen layer in a freezing process. Specifically, FIG. 4 illustrates an example of a change in reflected light intensity from the processing liquid 210 or frozen layer 210a in a case where a freezing process is performed in accordance with a recipe. In FIG. 4, the horizontal axis indicates the time, and the vertical axis indicates the reflected light intensity. From the time point to, the processing liquid is supplied onto the upper face of a substrate 200, and the cooling medium is supplied onto the lower face of the substrate 200. As in the case of FIG. 2, for example, pure water at 25° C. is used as the processing liquid, and nitrogen gas cooled to −120° C. is used as the cooling medium.

At the time point t1, supply of the processing liquid is stopped, and, as explained with reference to FIG. 2, the processing liquid that is pure water passes through a supercooled state lower than the solidification point (0° C.), and is frozen into ice at the certain timing t2. In other words, the frozen layer 210a is formed. At this time, the reflected light intensity increases temporarily. Here, the peak intensity at this time is denoted by I1. Thereafter, the reflected light intensity falls gradually. At the time point t4, when cracks are generated in the frozen layer 210a, the reflected light intensity increases abruptly. Here, the peak intensity at this time is denoted by I2. Thereafter, the reflected light intensity falls quickly. Then, at the time point t5 prescribed in the recipe, supply of the processing liquid is restarted, and supply of the cooling medium is stopped.

As described above, during the freezing process, the two peaks appear in the reflected light intensity. The first one is a peak at the time when liquid is turned into solid, and the second one is a peak at the time when cracks are generated. The peak at crack generation occurs after the first peak, and is thought to occur when the reflected light intensity has become smaller than a predetermined degree after the first peak. In consideration of this, in the first embodiment, after the first peak is detected as described later, a determination for pre-detecting crack generation is started, and a set threshold for pre-detecting crack generation is set at A, for example. The controller 15 determines whether the reflected light intensity detected by the light receiving part 142 is smaller than the set threshold A. When the reflected light intensity is not smaller than A, the controller 15 continues the current state. On the other hand, when the reflected light intensity is smaller than A, the controller 15 changes a processing parameter, such as restarting supply of the processing liquid, or the like.

Figure 5:
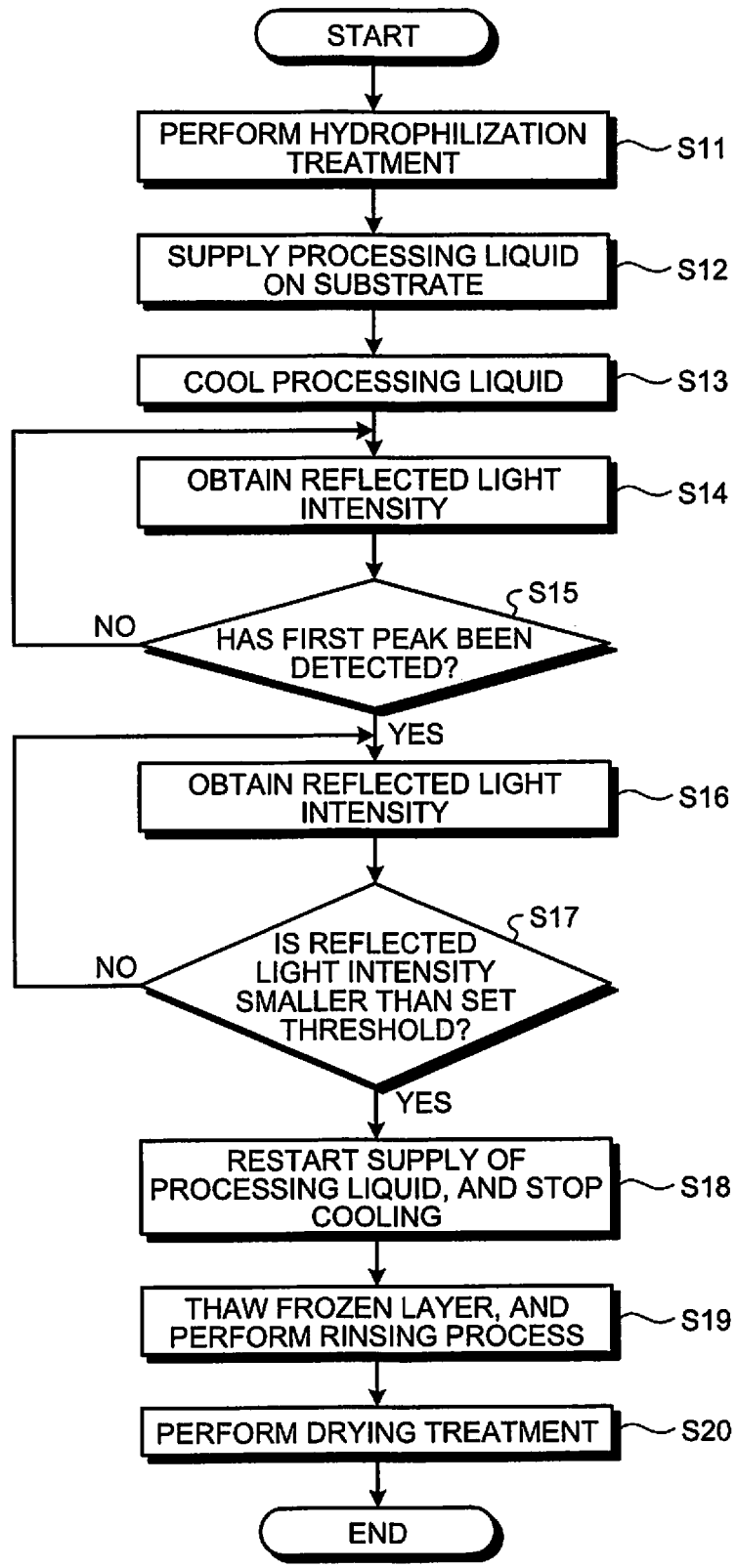
FIG. 5 is a flowchart illustrating an example of the sequence of a substrate processing method according to the first embodiment.

Next, an explanation will be given of a substrate processing method in the substrate processing apparatus described above. FIG. 5 is a flowchart illustrating an example of the sequence of a substrate processing method according to the first embodiment. First, before the freeze cleaning, a hydrophilization treatment is performed to the surface of the substrate 200 serving as a processing object (step S11). The substrate 200 includes a pattern formed thereon, which serves as an object to be cleaned. The hydrophilization treatment is performed by irradiating the surface of the substrate 200 with ultraviolet (UV) light, for example. Consequently, the surface of the substrate 200 becomes easier to be wetted with a processing liquid used for the freeze cleaning. Then, the substrate 200 subjected to the hydrophilization treatment is held on the stage 11.

Then, the processing liquid is supplied by the pump 124 through the pipe 123 and is delivered from the nozzle 122 onto the substrate 200, and a processing liquid 210 is thereby formed on the upper face of the substrate 200 (step S12). At this time, if the stage 11 is rotated about an axis perpendicular to the substrate mounting plane as the center, the processing liquid supplied on the substrate 200 can be substantially uniformly spread all over the substrate 200 to form the processing liquid 210.

Further, a cooling medium is supplied from the cooling medium supply section 13 through the pipe 132 to the supply port 113 of the stage 11, to cool the processing liquid 210 (step S13). The cooling medium is delivered from the supply port 113 at the center of the stage 11, and flows toward the outer periphery of the substrate 200 through the gap between the lower face of the substrate 200 and the upper surface of the stage 11. At this time, as the cooling medium comes into contact with the lower face of the substrate 200, the substrate 200 is cooled from the lower face side. Then, the temperature on the upper face side of the substrate 200 becomes a temperature equal to or lower than the solidification point of the processing liquid, and the processing liquid 210 is frozen at a certain timing. The processing liquid 210 is frozen in order from the part in contact with the substrate 200.

Thereafter, the state of the processing liquid 210 or frozen layer 210a is monitored by the monitoring section 14. Specifically, light is emitted from the light source 141 and is reflected by the processing liquid 210 or frozen layer 210a. The light receiving part 142 detects this reflected light, and sends the detection result to the controller 15. The controller 15 obtains reflected light intensity detected by the light receiving part 142 (step S14). The controller 15 stores the reflected light intensity in time series, for example, and forms a graph therefrom, for example.

Then, the controller 15 determines whether the first peak has been detected in the reflected light intensity (step S15). As described above, the first peak appears when the processing liquid 210 changes its state into the frozen layer 210a. When the first peak has not yet been detected (No at step S15), the processing sequence returns to step S14.

When the first peak has been detected (Yes at step S15), the controller 15 obtains reflected light intensity detected by the light receiving part 142 (step S16), and determines whether the reflected light intensity is smaller than a set threshold (step S17). When the reflected light intensity is not smaller than the set threshold (No at step S17), the processing sequence returns to step S16. On the other hand, when the reflected light intensity is smaller than the set threshold (Yes at step S17), the controller 15 restarts supply of the processing liquid, and stops cooling (step S18). Specifically, for example, the processing liquid at room temperature is supplied onto the upper face of the substrate 200, and supply of the cooling medium is stopped. Thus, the frozen layer 210a is thawed, and a rinsing process is performed to the upper face of the substrate 200 (step S19).

Thereafter, the substrate 200 is dried (step S20), and the freezing process for the substrate 200 ends.

Figure 6:
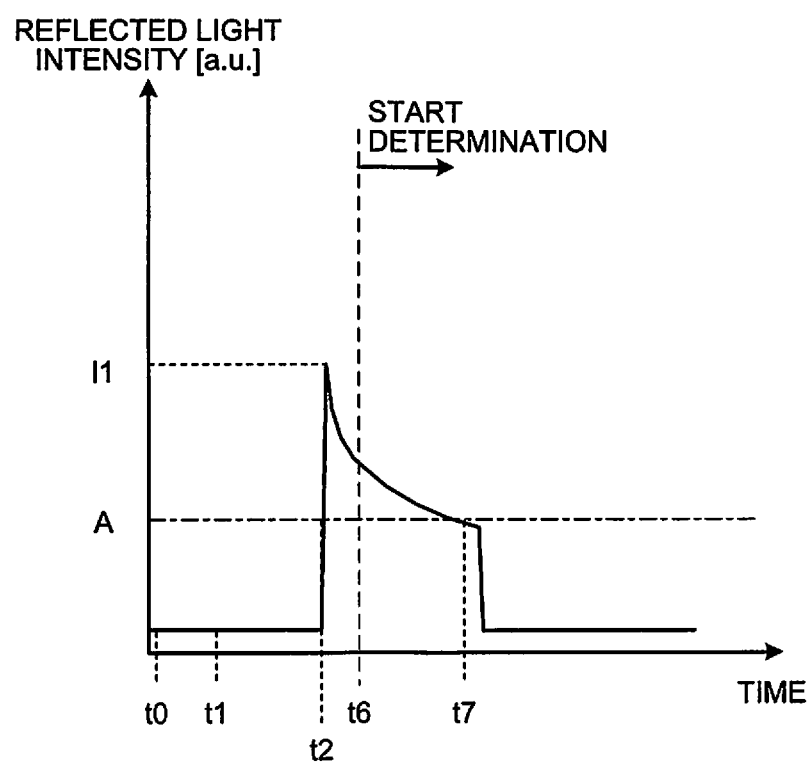
FIG. 6 is a diagram illustrating an example of a change in reflected light intensity with time, obtained from a processing liquid or frozen layer in a freezing process according to the first embodiment.

FIG. 6 is a diagram illustrating an example of a change in reflected light intensity with time, obtained from the processing liquid or frozen layer in the freezing process according to the first embodiment. In FIG. 6, the horizontal axis indicates the time, and the vertical axis indicates the reflected light intensity. As in the case of FIG. 4, at the time point t0, supply of the processing liquid onto the upper face of the substrate 200 is started, and supply of the cooling medium onto the lower face of the substrate 200' is also started. At the time point t1, supply of the processing liquid is stopped. Then, at the time point t2, the processing liquid 210 is frozen into the frozen layer 210a. At this time, the first peak occurs. Accordingly, the determination using the set threshold A comes to be performed from a time point t6 given after detection of the first peak.

Then, at a time point t7, as the reflected light intensity becomes smaller than the set threshold A, the processing liquid is supplied onto the upper face of the substrate 200, and supply of the cooling medium is stopped. Consequently, a melting process can be performed to the frozen layer 210a before cracks are generated in the frozen layer 210a.

A force applied to the pattern arranged on the upper face of the substrate 200 changes greatly between before and after crack generation. Accordingly, where the upper face of the substrate 200 is provided with a fine pattern having a risk of collapse, the determination using a threshold is performed as illustrated in step S17 of FIG. 5. For example, the fine pattern is a pattern in which the minimum dimension in the pattern is 100 nm or less. On the other hand, where the upper face of the substrate 200 is provided only with a pattern having no risk of collapse, or where the upper face of the substrate 200 is provided with no pattern, the following sequence may be adopted rather than the determination using a threshold as in FIG. 5. Specifically, after cracks are generated in the frozen layer 210a, supply of the processing liquid is restarted and the cooling is stopped. This enables more foreign substances to be removed. Accordingly, the controller 15 may determine whether the determination using a threshold as in FIG. 5 should be applied, in accordance with the type of the substrate 200. For example, the pattern having no risk of collapse is a pattern in which the minimum dimension in the pattern is larger 100 nm.

Figure 7:
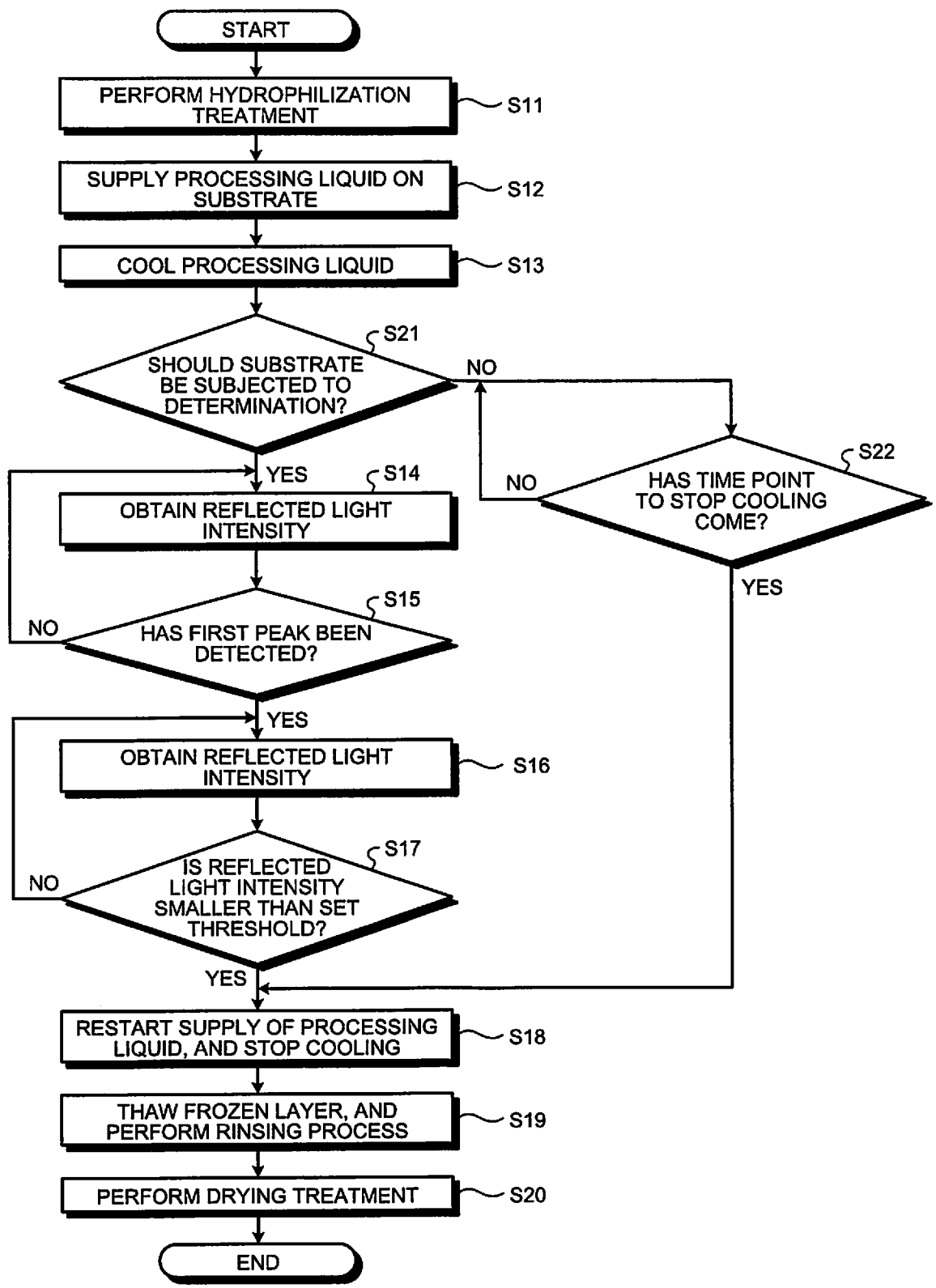
FIG. 7 is a flowchart illustrating another example of the sequence of a substrate processing method according to the first embodiment.

FIG. 7 is a flowchart illustrating another example of the sequence of a substrate processing method according to the first embodiment. Here, an explanation will be given only of steps different from those of FIG. 5. After the processing liquid is cooled in step S13, the controller 15 determines whether the substrate is a substrate that should be subjected to the determination using reflected light intensity (step S21). Specifically, the controller 15 determines whether the substrate is a substrate including a fine pattern having a risk of collapse, a substrate including no pattern arranged thereon, or a substrate including only a pattern having no risk of collapse.

When the substrate is a substrate that should be subjected to the determination using reflected light intensity (Yes at step S21), i.e., a substrate including a fine pattern having a risk of collapse, the sequential steps from step S14 are performed.

On the other hand, when the substrate is not a substrate that should be subjected to the determination using reflected light intensity (No at step S21), e.g., a substrate including no pattern arranged thereon, or a substrate including only a pattern having no risk of collapse, the controller 15 determines whether the time point to stop cooling has come (step S22). This is determined by whether a predetermined time prescribed in the recipe has elapsed since the start of cooling to the processing liquid 210. When the time point to stop cooling has not yet come (No at step S22), a waiting state follows until the time point to stop cooling. On the other hand, when the time point to stop cooling has come (Yes at step S22), the processing sequence shifts to step S18.

It should be noted that, although the above explanation takes as an example a case where reflected light derived from light radiated to the substrate 200 is received, transmitted light may be received in place of the reflected light to perform the determination by using transmitted light intensity. Further, the monitoring section 14 may be configured to monitor a state change of the frozen layer by obtaining continuous images of the substrate surface and performing image processing, in addition to the reflected light intensity or transmitted light intensity derived from light radiated to the substrate 200. For example, as pure water is being cooled, its ice transparency keeps changing. Thus, this transparency may be used to perform the determination.

In the first embodiment, reflected light intensity derived from light radiated to the frozen layer 210a is monitored, to stop the cooling and then to thaw the frozen layer 210a before cracks are generated. Consequently, with respect to a substrate 200 including a fine pattern having a risk of collapse, it is possible to prevent collapse of the fine pattern, while removing foreign substances 220 attaching to the upper face of the substrate 200.

Further, in accordance with whether the substrate 200 is a substrate 200 including a fine pattern having a risk of collapse, a substrate 200 including no pattern arranged thereon, or a substrate 200 including only a pattern having no risk of collapse, it is determined whether to perform the determination process during the cooling, which uses monitoring of the reflected light intensity. Consequently, with respect to a substrate 200 including a fine pattern having a risk of collapse, it is possible to prevent collapse of the fine pattern, while removing foreign substances attaching to the upper face of the substrate 200. On the other hand, with respect to a substrate 200 including no pattern arranged thereon, or a substrate 200 including only a pattern having no risk of collapse, it is possible to remove more foreign substances attaching to the upper face of the substrate 200, as compared with the case of a substrate 200 including a fine pattern having a risk of collapse.

Second Embodiment

In the first embodiment, the monitoring section is configured to monitor the state of the frozen layer by using light. In the second embodiment, an explanation will be given of a case where the monitoring section is configured to monitor the state of the frozen layer by using acoustic waves.

Figure 8:
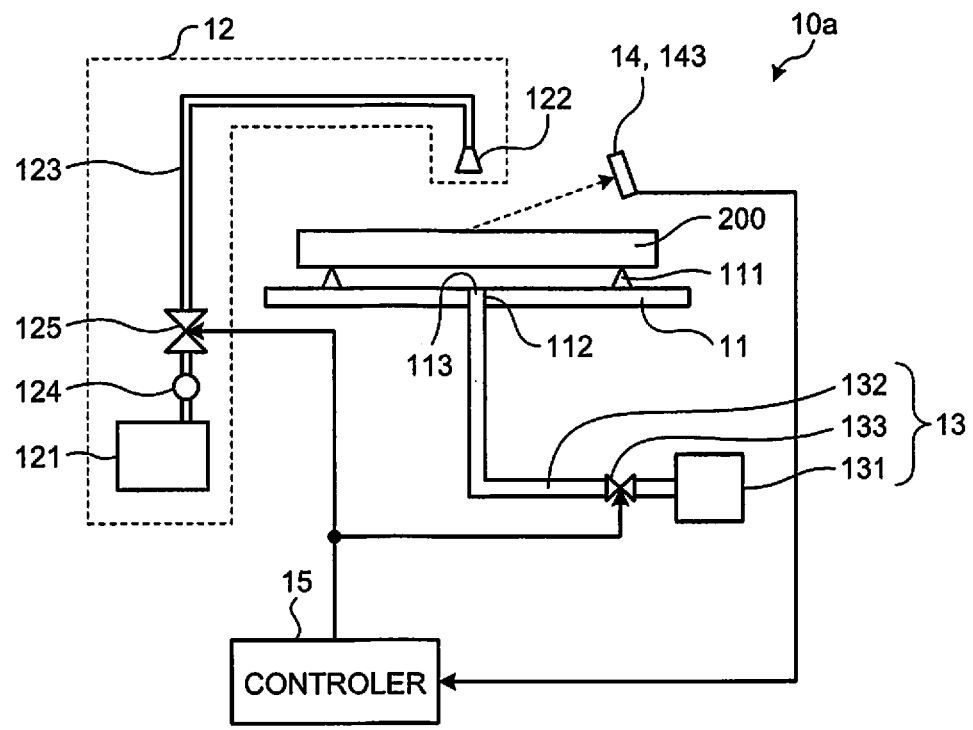
FIG. 8 is a diagram schematically illustrating a configuration example of a substrate processing apparatus according to a second embodiment.

FIG. 8 is a diagram schematically illustrating a configuration example of a substrate processing apparatus according to the second embodiment. Here, an explanation will be given only of parts different from those of the first embodiment. In the substrate processing apparatus 10a according to the second embodiment, the monitoring section 14 is formed of an acoustic wave detecting part 143. The acoustic wave detecting part 143 is configured to detect acoustic waves called acoustic emission waves (which will be referred to as "AE waves", hereinafter). In general, when temperature is lowered and a material is contracted, AE waves (longitudinal waves) are emitted. The acoustic wave detecting part 143 detects the intensity of such AE waves.

In the second embodiment, the controller 15 uses AE wave intensity reported from the monitoring section 14 (acoustic wave detecting part 143) to determine whether the present state is a state where cracks of the frozen layer 210a are likely to be generated. When cracks are likely to be generated, the controller 15 controls the substrate processing apparatus 10a by changing a processing parameter.

Figure 9:
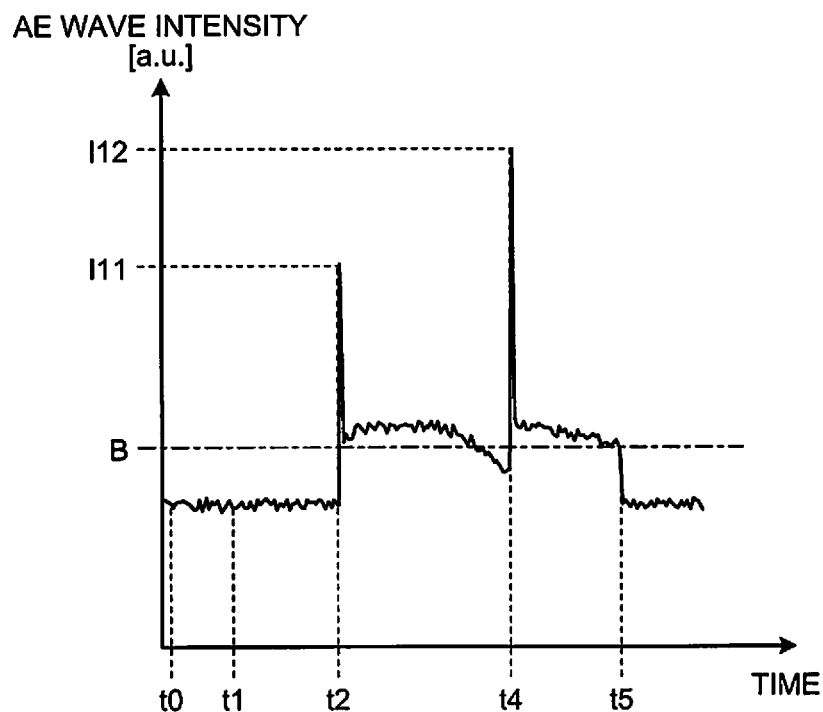
FIG. 9 is a diagram illustrating an example of a change in AE wave intensity with time, obtained from a processing liquid or frozen layer in a substrate processing method.

Next, an explanation will be given of a method of pre-detecting crack generation by using the controller 15. FIG. 9 is a diagram illustrating an example of a change in AE wave intensity with time, obtained from the processing liquid or frozen layer in a substrate processing method. Specifically, FIG. 9 illustrates an example of a change in AE wave intensity from the processing liquid 210 or frozen layer 210a in a case where a freezing process is performed in accordance with a recipe. In FIG. 9, the horizontal axis indicates the time, and the vertical axis indicates the AE wave intensity. From the time point t0, the processing liquid is supplied onto the upper face of a substrate 200, and the cooling medium is supplied onto the lower face of the substrate 200. As in the case of FIG. 2, for example, pure water at 25° C. is used as the processing liquid, and nitrogen gas cooled to −120° C. is used as the cooling medium.

At the time point t1, supply of the processing liquid is stopped, and, as explained with reference to FIG. 2, the pure water passes through a super-cooled state lower than the solidification point (0° C.), and is frozen into ice at the certain timing t2. In other words, the frozen layer 210a is formed. At this time, the AE wave intensity increases temporarily, and forms a peak having intensity Il1. In the example of FIG. 9, in the AE wave intensity, the base line of the solid state is higher than the base of the liquid state. Thereafter, at the time point t4, when cracks are generated in the frozen layer 210a, the AE wave intensity increases temporarily, and forms a peak having intensity 112. Then, at the time point t5, supply of the processing liquid is restarted, and supply of the cooling medium is stopped. Here, before the peak at the time point t4, a phenomenon is seen in which the base line decreases gradually.

As described above, during the freezing process, the two peaks appear in the AE wave intensity. The first one is a peak at the time when liquid is turned into solid, and the second one is a peak at the time when cracks are generated. The peak at crack generation occurs after the first peak, and is thought to occur when the AE wave intensity has become smaller than a predetermined degree after the first peak. In consideration of this, in the second embodiment, after the first peak is detected as described later, a determination for pre-detecting crack generation is started, and a set threshold for pre-detecting crack generation is set at B, for example. The controller 15 determines whether the AE wave intensity detected by the acoustic wave detecting part 143 is smaller than the set threshold B. When the AE wave intensity is not smaller than B, the controller 15 continues the current state. On the other hand, when the AE wave intensity is smaller than B, the controller 15 changes a processing parameter, such as restarting supply of the processing liquid, or the like.

Figure 10:
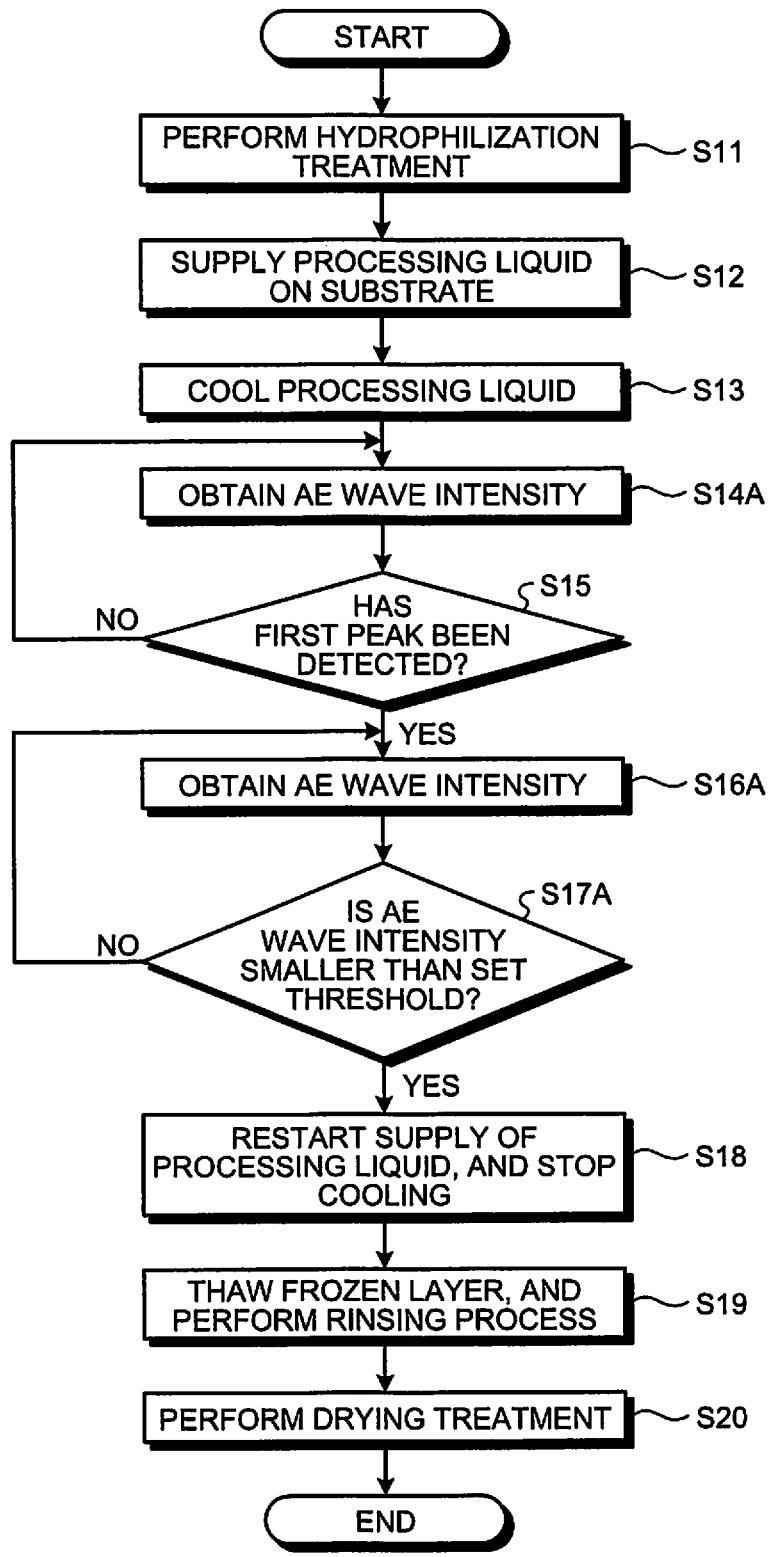
FIG. 10 is a flowchart illustrating an example of the sequence of a substrate processing method according to the second embodiment.

Next, an explanation will be given of a substrate processing method in the substrate processing apparatus described above. FIG. 10 is a flowchart illustrating an example of the sequence of a substrate processing method according to the second embodiment. The substrate processing method according to the second embodiment is almost the same as that of FIG. 5 according to the first embodiment. However, the steps in the first embodiment that use the reflected light intensity are replaced with those using the AE wave intensity.

For example, after the processing liquid is cooled in step S13, the controller 15 obtains AE wave intensity from the acoustic wave detecting part 143 (step S14A). Further, when the first peak has been detected in step S15 (Yes at step S15), the controller 15 obtains AE wave intensity (step S16A), and determines whether the AE wave intensity is smaller than a set threshold (step S17A). The other steps are substantially the same as those described in the first embodiment, and thus their description will be omitted.

Figure 11:
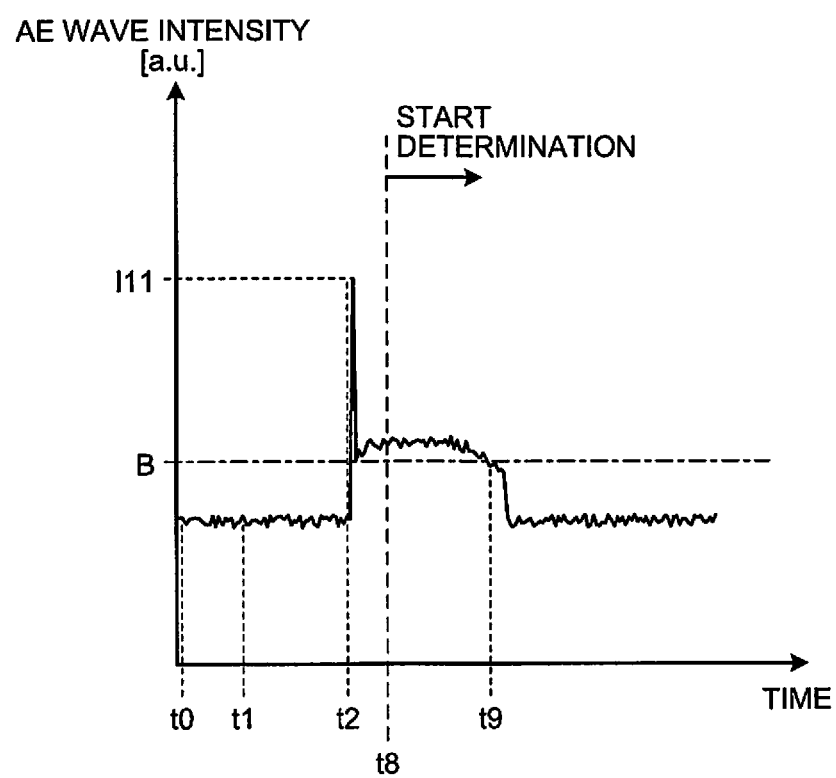
FIG. 11 is a diagram illustrating an example of a change in AE wave intensity with time, obtained from a processing liquid or frozen layer in the substrate processing method according to the second embodiment.

FIG. 11 is a diagram illustrating an example of a change in AE wave intensity with time, obtained from the processing liquid or frozen layer in the substrate processing method according to the second embodiment. In FIG. 11, the horizontal axis indicates the time, and the vertical axis indicates the AE wave intensity. As in the case of FIG. 9, at the time point t0, supply of the processing liquid onto the upper face of the substrate 200 is started, and supply of the cooling medium onto the lower face of the substrate 200 is also started. At the time point t1, supply of the processing liquid is stopped. Then, at the time point t2, the processing liquid 210 is frozen into the frozen layer 210a. At this time, the first peak occurs. Accordingly, the determination using the set threshold B comes to be performed from a time point t8 given after detection of the first peak.

Then, at the time point t9, as the AE wave intensity becomes smaller than the set threshold B, the processing liquid is supplied onto the upper face of the substrate 200, and supply of the cooling medium is stopped. Consequently, a melting process can be performed to the frozen layer 210a before cracks are generated in the frozen layer 210a.

Here, also in the second embodiment, as in FIG. 7 according to the first embodiment, the controller 15 may determine whether the substrate is a substrate including a fine pattern having a risk of collapse, a substrate including no pattern arranged thereon, or a substrate including only a pattern having no risk of collapse, to change the subsequent processing sequence in accordance with the determination result.

Also in the second embodiment, an effect substantially the same as that of the first embodiment can be obtained.

Third Embodiment

In the first and second embodiments, an explanation has been given of a case where the frozen layer on a substrate in the freeze cleaning is monitored to perform the melting process to the frozen layer before crack generation. In the third embodiment, an explanation will be given of a case where a crack generation time obtained from the past processing is used to determine a processing time of the freeze cleaning not to entail crack generation, and then a substrate processing method is performed in accordance with this processing time.

Figure 12:
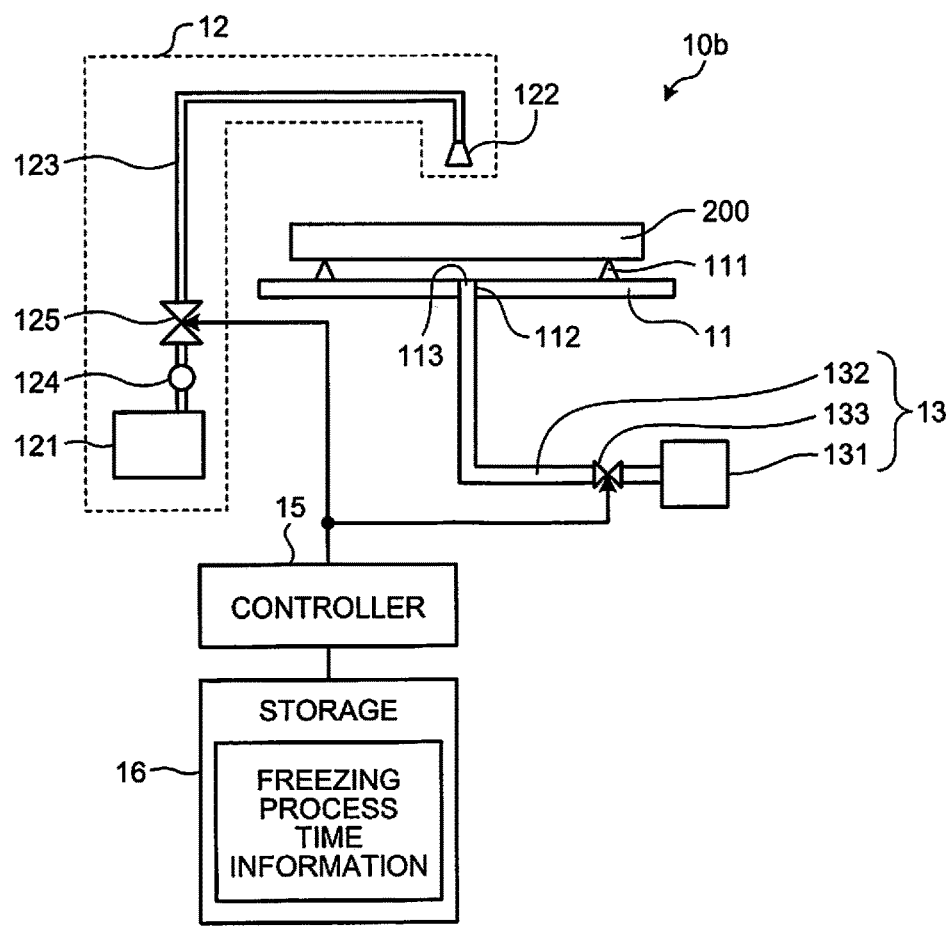
FIG. 12 is a diagram schematically illustrating a configuration example of a substrate processing apparatus according to a third embodiment.

FIG. 12 is a diagram schematically illustrating a configuration example of a substrate processing apparatus according to the third embodiment. Here, an explanation will be given only of parts different from those of the first embodiment. In the substrate processing apparatus 10b according to the third embodiment, the monitoring section 14 is not provided, but a storage 16 is provided. The storage 16 stores freezing process time information. The freezing process time information is information that correlates the state of a substrate 200, the freezing process conditions, and the freezing process time until crack generation, with each other. This information is made on the premise that, when cases are similar to each other about the freezing process conditions including the flow rate and temperature of the cooling medium, and also about the state of a substrate 200, these cases are almost the same as each other about time until crack generation. Here, the freezing process conditions are obtained by recording freezing process conditions including the flow rate and temperature of the cooling gas, together with the state of a substrate 200 and the freezing process time until crack generation, as past examples.

From the freezing process time information in the storage 16, the controller 15 obtains a freezing process time corresponding to a combination of the state of a substrate 200 with freezing process conditions, which is similar to the combination of the state of a substrate 200 to be processed from now, with freezing process conditions for the same. Then, the controller 15 sets the freezing process time thus obtained, as a time of from the supply start of the cooling medium until the supply stop thereof. Then, the controller 15 performs the freezing process on the basis of this freezing process time.

Figure 13:
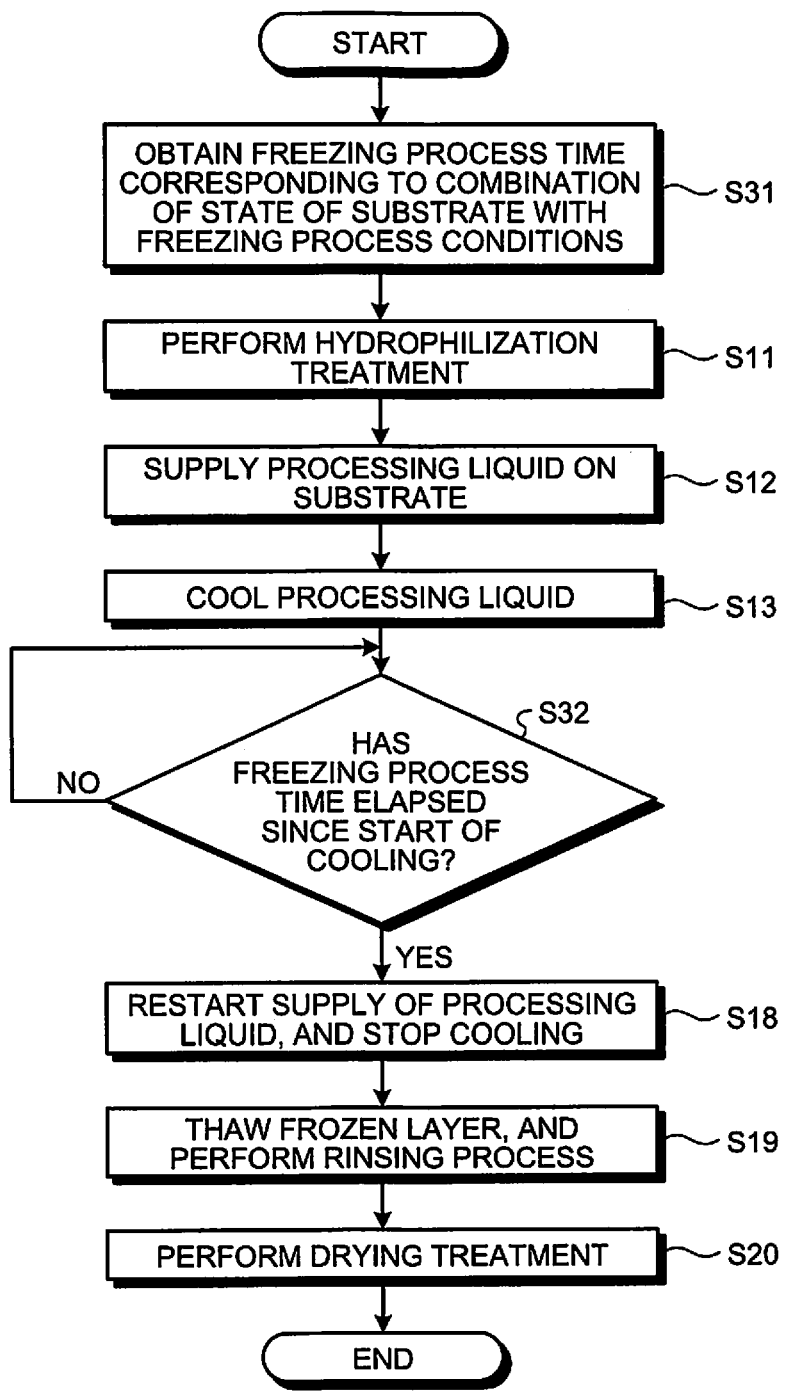
FIG. 13 is a flowchart illustrating an example of the sequence of a substrate processing method according to the third embodiment.

Next, an explanation will be given of a substrate processing method in the substrate processing apparatus described above. FIG. 13 is a flowchart illustrating an example of the sequence of a substrate processing method according to the third embodiment. Here, an explanation will be given only of steps different from those of FIG. 5 according to the first embodiment.

First, before the hydrophilization treatment of step S11, the controller 15 obtains a freezing process time corresponding to the combination of the state of a substrate 200 to be used, with freezing process conditions to be implemented to the substrate 200, from the freezing process time information in the storage 16 (step S31). Thereafter, the processing sequence shifts to step S11.

Further, after the processing liquid is cooled in step S13, the controller 15 determines whether the freezing process time obtained in step S11 has elapsed since the start of cooling (step S32). The controller 15 performs this determination by using a timer to clock the time since the start of cooling to the processing liquid 210 in step S13, for example. When the freezing process time has not yet elapsed since the start of cooling (No at step S32), a waiting state follows until the freezing process time has elapsed.

When the freezing process time has elapsed since the start of cooling (Yes at step S32), the controller 15 restarts supply of the processing liquid, and stops cooling to the substrate 200, as in step S17.

Further, also in the third embodiment, as in FIG. 7 according to the first embodiment, the controller 15 may determine whether the substrate is a substrate including a fine pattern having a risk of collapse, a substrate including no pattern arranged thereon, or a substrate including only a pattern having no risk of collapse, to change the subsequent processing sequence in accordance with the determination result. In this case, the freezing process time information has been prepared such that, where the state of a substrate 200 shows a substrate including a fine pattern having a risk of collapse, a time before crack generation is set as the freezing process time. Further, where the state of a substrate 200 shows a substrate including no pattern arranged thereon, or a substrate including only a pattern having no risk of collapse, a time longer than the time corresponding to crack generation is set as the freezing process time.

In the third embodiment, when the freezing process is to be performed, the controller 15 makes reference to the freezing process time until crack generation, recorded as past examples, and determines an actual processing time in accordance with a risk of collapse of a fine pattern formed on the substrate 200. Consequently, although real time monitoring is not achieved, there is no need to provide a configuration to monitor the frozen layer 210a, unlike the first and second embodiments. As a result, in addition to the effect obtained by the first embodiment, it is possible to obtain an effect to manufacture the substrate processing apparatus 10b with a lower cost, as compared with the first and second embodiments.

Fourth Embodiment

FIG. 14 is a diagram schematically illustrating a configuration example of a substrate processing system according to a fourth embodiment. The substrate processing system 500 illustrated as an example of a production system includes a processing section 501, an operation device 502, a storage 503, and a control device 504.

The processing section 501 is a composite processing apparatus for cleaning a substrate 200. The processing section 501 includes, for example, a loader/unloader 511, a substrate conveyer 512, a substrate reversing unit 513, a pre-treatment unit 514, an acid/pure water processing unit 515, an alkali/pure water processing unit 516, a freezing unit 517, an organic treatment unit 518, and a heat treatment unit 519. A pre-treatment prior to a cleaning process is performed in the pre-treatment unit 514, the cleaning process is performed in the acid/pure water processing unit 515, the alkali/pure water processing unit 516, and the freezing unit 517, and a post-treatment is performed in the organic treatment unit 518 and the heat treatment unit 519.

The loader/unloader 511 is arranged to load a substrate 200 before cleaning into the processing section 501, and to unload the substrate after cleaning from the processing section 501.

The substrate conveyer 512 includes transfer devices (not illustrated). The substrate conveyer 512 is arranged to convey substrates 200 loaded in the processing section 501, inside the processing section 501. The upper faces of substrates 200 carried out of the acid/pure water processing unit 515, the alkali/pure water processing unit 516, and the freezing unit 517 are entirely covered with a liquid (pure water), and the substrates 200 are transferred in this state to the respective next units.

The substrate reversing unit 513 is arranged to reverse each substrate 200. Each substrate 200 is preferably clean on its frontside and backside. Accordingly, the substrate reversing unit 513 includes a reversing mechanism that switches the face to be cleaned of the substrate 200 to either of the frontside and backside, when the frontside and backside are to be cleaned. The substrate reversing unit 513 corresponds to a substrate reversing apparatus.

Figure 15A:
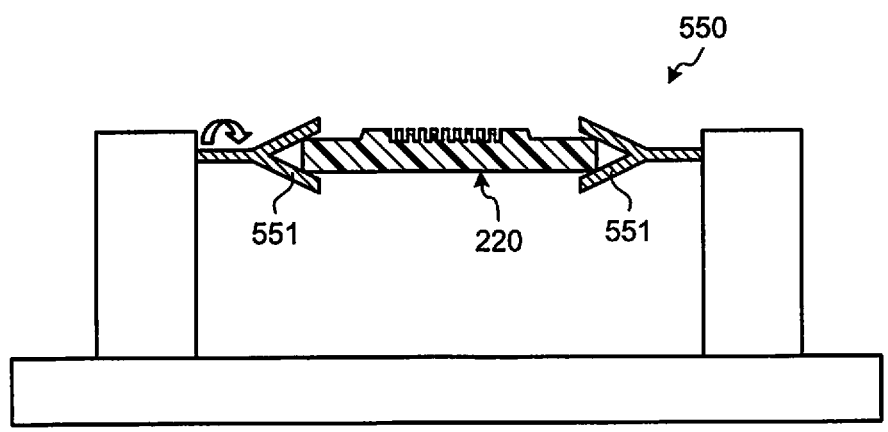
FIGS. 15A and 15B are diagrams schematically illustrating a configuration example of a reversing mechanism.
Figure 15B:
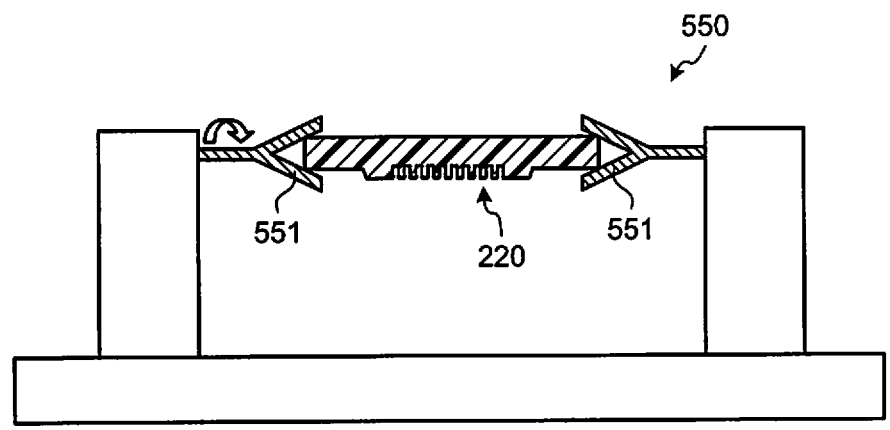

FIGS. 15A and 15B are diagrams schematically illustrating a configuration example of a reversing mechanism. In FIGS. 15A and 15B, in order to distinguish the frontside and backside of a substrate 200, the substrate 200 is exemplified by a template. Here, FIG. 15A illustrates a case where the substrate 200 is placed with its frontside oriented upward, and FIG. 15B illustrates a case where the substrate 200 is placed with its backside oriented upward. The reversing mechanism 550 includes support portions 551 arranged to support opposite lateral sides of the substrate 200. The support portions 551 are configured to be rotatable about a predetermined direction as the center, which is parallel with the substrate plane of the substrate 200. The reversing mechanism 550 reverses the substrate 200 supported by the support portions 551, as illustrated in FIG. 15B, by rotating the support portions 551.

The pre-treatment unit 514 is arranged to perform a pre-treatment to the substrate 200. For example, the pre-treatment is a hydrophilization treatment. In this case, the pre-treatment unit 514 includes a stage for holding the substrate 200, and a light source for irradiating the substrate held on the stage with UV light. The pre-treatment unit 154 corresponds to a pre-treatment apparatus.

The acid/pure water processing unit 515 is arranged to perform, to the substrate 200, a cleaning process using an acid solution and pure water (which will be referred to as "acid/pure water process", hereinafter), or a cleaning process using pure water (which will be referred to as "pure water process", hereinafter). The acid/pure water processing unit 515 includes an acid processing part for performing a cleaning process using an acid solution, and a pure water processing part for performing cleaning using pure water. In the acid/pure water process, cleaning using an acid solution is performed, and then cleaning using pure water is performed. At this time, the pure water may contain an additive or the like for resistivity control or the like. The acid solution may be exemplified by sulfuric acid solution, a mixed solution of sulfuric acid and hydrogen peroxide solution, hydrogen peroxide solution, ozonized water, carbonated water, or the like. Further, after the cleaning is completed, the upper face of the substrate 200 is entirely covered with pure water by the pure water processing part. Accordingly, the substrate 200 is transferred from the acid/pure water processing unit 515 to the next unit, in a state where the upper face of the substrate 200 is entirely covered with pure water.

The alkali/pure water processing unit 516 is arranged to perform, to the substrate 200, a cleaning process using an alkali solution and pure water (which will be referred to as "alkali/pure water process", hereinafter), or the pure water process. The alkali/pure water processing unit 516 includes an alkali processing part for performing a cleaning process using an alkali solution, and a pure water processing part for performing cleaning using pure water. In the alkali/pure water process, cleaning using an alkali solution is performed, and then cleaning using pure water is performed. At this time, the pure water may contain an additive or the like for resistivity control or the like. The alkali solution may be exemplified by aqueous ammonia, a mixed solution (SC-1) of aqueous ammonia and hydrogen peroxide solution, potassium hydroxide solution, tetramethyl ammonium hydroxide (TMAH) solution, or the like. Further, after the cleaning is completed, the upper face of the substrate 200 is entirely covered with pure water by the pure water processing part. Accordingly, the substrate 200 is transferred from the alkali/pure water processing unit 516 to the next unit, in a state where the upper face of the substrate 200 is entirely covered with pure water.

Here, a case where only the pure water process is performed in the acid/pure water processing unit 515 and the alkali/pure water processing unit 516 includes not only a case where cleaning is performed by using pure water, but also a case where cleaning is performed by using pure water to which a surfactant, a slight amount of acid or alkali, and/or the like have been added. The acid/pure water processing unit 515 and the alkali/pure water processing unit 516 correspond to a cleaning unit.

The freezing unit 517 is arranged to perform a freezing process to the substrate 200. The freezing unit 517 corresponds to a freezing apparatus. In the freezing process, a processing liquid is formed on the upper face of the substrate 200, and the processing liquid is frozen to form a frozen layer by using a cooling medium having a temperature lower than the solidification point of the processing liquid. Then, this frozen layer is melted, and the processing liquid is removed. The freezing process can be of any type, as long as the process includes such a processing sequence mentioned above. For example, the freezing process described in one of the first to third embodiments may be used.

The organic treatment unit 518 is arranged to perform an organic treatment to the substrate 200. For example, the organic treatment may be exemplified by a treatment that supplies an organic solvent of isopropyl alcohol or the like onto the upper face (cleaning object face) of the substrate 200 and then performs drying to the substrate 200, or the like. With this treatment, a slight amount of moisture remaining on the upper face of the substrate 200 can be removed.

The heat treatment unit 519 is arranged to perform a heat treatment to the substrate 200. The heat treatment is performed to remove a slight amount of moisture remaining on the upper face of the substrate 200. Accordingly, the heat treatment preferably heats the substrate 200 to a temperature of 100° C. or more.

The operation device 502 includes, for example, a touch panel for performing input operations or the like, a display for visualizing and displaying operational status, and so forth, for operators to manage the substrate processing system 500.

The storage 503 stores, for example, control recipes or the like to implement cleaning processes to substrates 200.

The control device 504 includes, for example, a microprocessor. The control device 504 reads a control recipe from the storage 503, on the basis of an instruction from the operation device 502. The control device 504 controls the processing section 501 in accordance with the control recipe.

Next, an explanation will be given of a substrate processing method in the substrate processing system 500 described above. There is a case where a face of a substrate 200 on which a pattern is arranged (which will be referred to as "pattern arrangement face", hereinafter) is contaminated by the freezing unit 517 of the substrate processing system 500. It is thought that, in general, this contamination is caused in a case where a contaminated cooling medium is used or in a case where ice or frost generated on the substrate 200 due to cooling causes impurities in the atmosphere to attach thereto. Accordingly, the contamination risk is high on a face to be in contact with the cooling medium. Particularly, contamination to the pattern arrangement face has to be prevented more strictly than contamination to the backside. For example, in the first to third embodiments, the cooling medium is supplied from the backside side of the substrate 200, and thus the contamination risk is lower, as compared with a case where a cooling medium is supplied from the frontside side. The processing method in the substrate processing system 500 is different, depending on the degree of the contamination risk to the pattern arrangement face of the substrate 200 in the substrate processing apparatus, as described above. Further, the processing method in the substrate processing system 500 is different, also depending on whether the substrate processing apparatus is provided with a mechanism for reducing the contamination risk to the face to be in contact with a cooling medium, such as a filtering mechanism, a frost generation preventing mechanism, an environment clean-up mechanism, or the like. Accordingly, next, explanations will be given separately of a case where there is a risk that the pattern arrangement face could be contaminated by the freezing process, and a case where there is no risk of such contamination.

FIG. 16 is a flowchart illustrating an example of an outline of the sequence of a substrate processing method according to the fourth embodiment, in a case where there is a risk that the pattern arrangement face could be contaminated. First, in a state where the frontside of a substrate 200 is on the upper side, a pre-treatment is performed to the frontside that is now the upper face of the substrate 200 (step S51). As the pre-treatment, there is a hydrophilization treatment that irradiates the frontside, i.e., the upper face of the substrate 200 with UV light or Vacuum Ultra Violet (VUV) light. Here, this irradiation treatment with UV light or VUV light may be replaced with an acid treatment.

Then, a cleaning process is performed to the frontside of the substrate 200 (step S52). As the cleaning process, at least one or more processes of the acid/pure water process, the alkali/pure water process, the pure water process, and the freezing process are performed.

Thereafter, the substrate 200 is reversed (step S53), to set a state where the frontside of the substrate 200 is on the lower side, and a cleaning process is performed to the backside that is now the upper face of the substrate 200 (step S54). As the cleaning process, at least one or more processes of the acid/pure water process, the alkali/pure water process, the pure water process, and the freezing process are performed.

Then, the substrate 200 is reversed (step S55), to set a state where the frontside of the substrate 200 is on the upper side, and a cleaning process is performed to the frontside that is now the upper face of the substrate 200 (step S56). As the cleaning process, at least one or more processes of the acid/pure water process, the alkali/pure water process, and the pure water process are performed.

Thereafter, in a state where the frontside of the substrate 200 is on the upper side, a post-treatment is performed to the upper face of the substrate 200 (step S57). As the post-treatment, at least one or more treatments of the organic treatment and the heat treatment are performed. Here, the post-treatment is not performed, as the case may be. As a result, the processing sequence ends.

Figure 17:
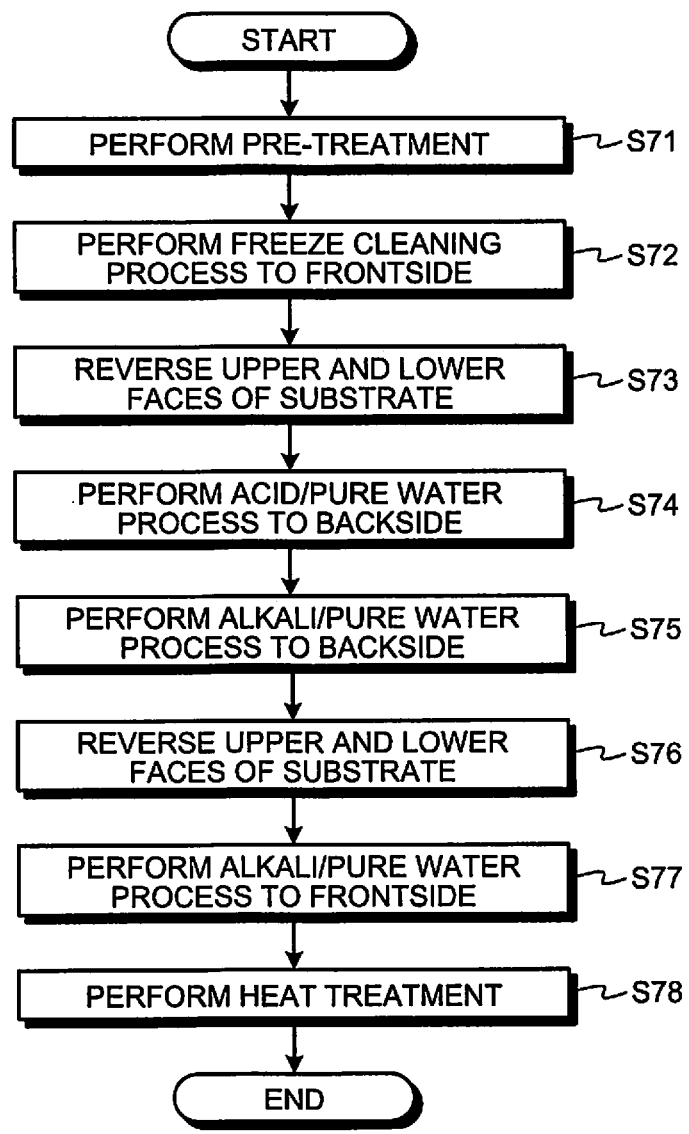
FIG. 17 is a flowchart illustrating an example of the processing sequence of a substrate processing method according to the fourth embodiment, in a case where there is a risk that the pattern arrangement face could be contaminated.

FIG. 17 is a flowchart illustrating an example of the processing sequence of a substrate processing method according to the fourth embodiment, in a case where there is a risk that the pattern arrangement face could be contaminated. First, a substrate 200 is loaded into the substrate processing system 500 through the loader/unloader 511, in a state where the frontside of the substrate 200 is on the upper side. Then, the substrate 200 is carried out of the loader/unloader 511, and is carried into the pre-treatment unit 514, by using a transfer device of the substrate conveyer 512. In the pre-treatment unit 514, a pre-treatment is performed to the substrate 200 (step S71). The pre-treatment is exemplified by the hydrophilization treatment that irradiates the upper face of the substrate 200 with UV.

Then, the substrate 200 is transferred from the pre-treatment unit 514 to the freezing unit 517 by a transfer device of the substrate conveyer 512. Then, in the freezing unit 517, the freezing process is performed to the frontside of the substrate 200 (step S72). The upper face of the substrate 200 subjected to the freezing process is in a state entirely covered with pure water.

Thereafter, the substrate 200 covered with pure water is transferred from the freezing unit 517 to the substrate reversing unit 513 by a transfer device of the substrate conveyer 512. Then, the upper and lower faces of the substrate 200 are reversed by the substrate reversing unit 513 (step S73). Specifically, the substrate 200 is reversed into a state where the frontside of the substrate 200 is on the lower side. Consequently, the upper face of the substrate 200 becomes the backside.

Then, the substrate 200 is transferred from the substrate reversing unit 513 to the acid/pure water processing unit 515 by a transfer device of the substrate conveyer 512. Then, in the acid/pure water processing unit 515, an acid process is performed to the backside of the substrate 200, and a pure water process is continuously further performed thereto (step S74). The upper face of the substrate 200 subjected to the pure water process is in a state entirely covered with pure water.

Thereafter, the substrate 200 covered with pure water is transferred from the acid/pure water processing unit 515 to the alkali/pure water processing unit 516 by a transfer device of the substrate conveyer 512. Then, in the alkali/pure water processing unit 516, an alkali process is performed, and a pure water process is continuously further performed (step S75). The upper face of the substrate 200 subjected to the pure water process is in a state entirely covered with pure water.

Then, the substrate 200 covered with pure water is transferred from the alkali/pure water processing unit 516 to the substrate reversing unit 513 by a transfer device of the substrate conveyer 512. Then, the upper and lower faces of the substrate 200 are reversed by the substrate reversing unit 513 (step S76). Specifically, the substrate 200 is reversed into a state where the frontside of the substrate 200 is on the upper side. Consequently, the upper face of the substrate 200 becomes the frontside.

Thereafter, the substrate 200 is transferred from the substrate reversing unit 513 to the alkali/pure water processing unit 516 by a transfer device of the substrate conveyer 512. Then, in the alkali/pure water processing unit 516, an alkali process is performed to the frontside of the substrate 200, and a pure water process is continuously further performed thereto (step S77). At this time, the frontside that is now the upper face of the substrate 200 is dried.

Thereafter, the substrate 200 is transferred from the alkali/pure water processing unit 516 to the heat treatment unit 519 by a transfer device of the substrate conveyer 512. Then, in the heat treatment unit 519, a heat treatment for removing moisture attaching to the surface of the substrate 200 is performed (step S78). Thereafter, the substrate 200 is transferred from the heat treatment unit 519 to the loader/unloader 511 by a transfer device of the substrate conveyer 512. Then, the substrate 200 is unloaded from the substrate processing system 500 through the loader/unloader 511. As a result, the substrate processing method ends.

Figure 18:
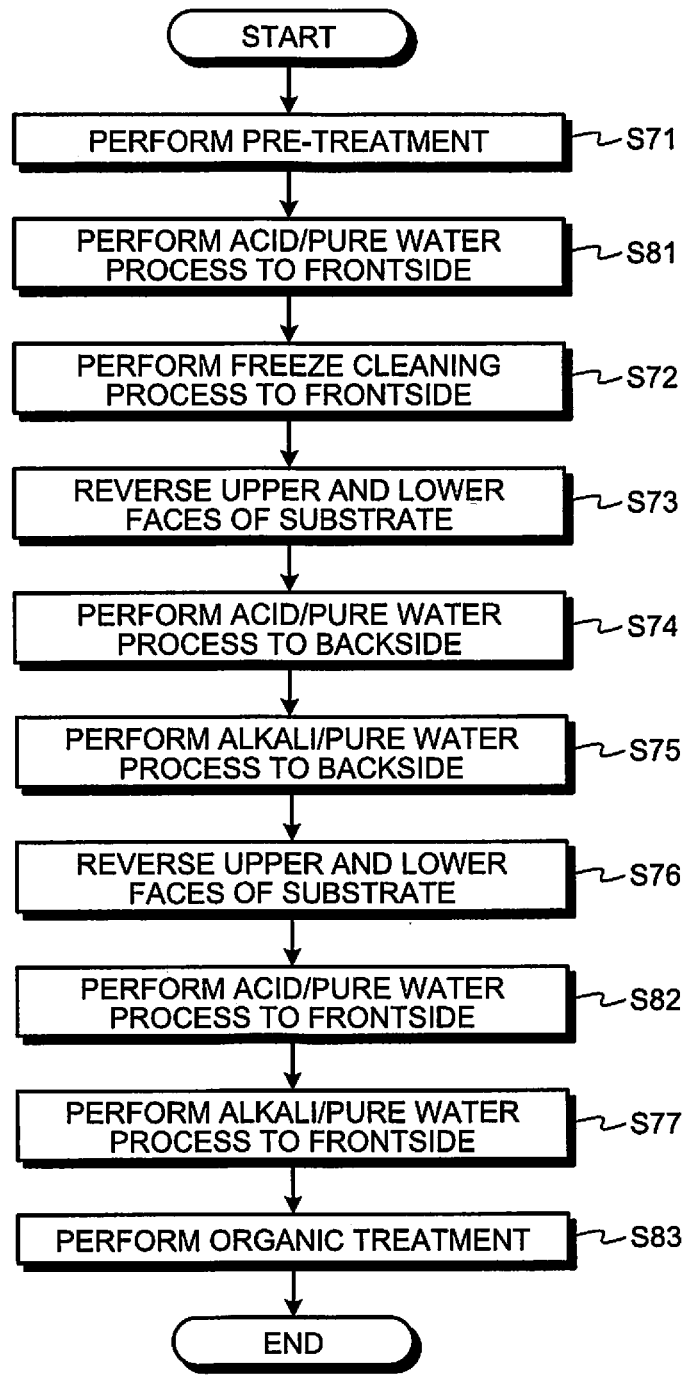
FIG. 18 is a flowchart illustrating another example of the processing sequence of a substrate processing method according to the fourth embodiment, in a case where there is a risk that the pattern arrangement face could be contaminated.

FIG. 18 is a flowchart illustrating another example of the processing sequence of a substrate processing method according to the fourth embodiment, in a case where there is a risk that the pattern arrangement face could be contaminated. In the flowchart of FIG. 18, as compared with that of FIG. 17, an acid process and a pure water process are continuously performed to the upper face that is the frontside of the substrate 200 here, in the acid/pure water processing unit 515 (step S81), between the pre-treatment of step S71 and the freezing process of step S72.

Further, an acid process and a pure water process are continuously performed to the upper face that is the frontside of the substrate 200 here, in the acid/pure water processing unit 515 (step S82), between the operation of reversing the upper and lower faces in step S76 and the alkali/pure water process to the frontside in step S77.

Further, in place of the heat treatment in step S78, an organic treatment is performed to the upper face that is the frontside of the substrate 200 here, in the organic treatment unit 518 (step S83).

The other steps are substantially the same as those described with reference to FIG. 17, and thus their description will be omitted. Further, FIGS. 17 and 18 illustrate mere examples. There are different types of variations in the substrate processing method, depending on the employed cleaning process, as described with reference to FIG. 16.

FIG. 19 is a flowchart illustrating an example of an outline of the sequence of a substrate processing method according to the fourth embodiment, in a case where there is no risk that the pattern arrangement face could be contaminated. First, in a state where the frontside of a substrate 200 is on the upper side, a pre-treatment is performed to the frontside that is now the upper face of the substrate 200 (step S91).

Then, the substrate 200 is reversed (step S92), to set a state where the frontside of the substrate 200 is on the lower side, and a cleaning process is performed to the backside that is now the upper face of the substrate 200 (step S93). As the cleaning process, at least one or more processes of the acid/pure water process, the alkali/pure water process, the pure water process, and the freezing process are performed.

Thereafter, the substrate 200 is reversed (step S94), to set a state where the frontside of the substrate 200 is on the upper side, and a cleaning process is performed to the frontside that is now the upper face of the substrate 200 (step S95). As the cleaning process, at least one or more processes of the acid/pure water process, the alkali/pure water process, the pure water process, and the freezing process are performed.

Then, in a state where the frontside of the substrate 200 is on the upper side, a post-treatment is performed to the upper face of the substrate 200 (step S96). As the post-treatment, at least one or more treatments of the organic treatment and the heat treatment are performed. Here, the post-treatment is not performed, as the case may be. As a result, the processing sequence ends.

FIG. 20 is a flowchart illustrating an example of the processing sequence of a substrate processing method according to the fourth embodiment, in a case where there is no risk that the pattern arrangement face could be contaminated. First, a substrate 200 is loaded into the substrate processing system 500 through the loader/unloader 511, in a state where the frontside of the substrate 200 is on the upper side. Then, the substrate 200 is carried out of the loader/unloader 511, and is carried into the pre-treatment unit 514, by using a transfer device of the substrate conveyer 512. In the pre-treatment unit 514, a pre-treatment is performed to the substrate 200 (step S111). The pre-treatment may be exemplified by the hydrophilization treatment that irradiates the upper face of the substrate 200 with UV.

Then, the substrate 200 is transferred from the pre-treatment unit 514 to the substrate reversing unit 513 by a transfer device of the substrate conveyer 512. Then, the upper and lower faces of the substrate 200 are reversed by the substrate reversing unit 513 (step S112). Specifically, the substrate 200 is reversed into a state where the frontside of the substrate 200 is on the lower side. Consequently, the upper face of the substrate 200 becomes the backside.

Then, the substrate 200 is transferred from the substrate reversing unit 513 to the acid/pure water processing unit 515 by a transfer device of the substrate conveyer 512. Then, in the acid/pure water processing unit 515, an acid process is performed to the backside of the substrate 200, and a pure water process is continuously further performed thereto (step S113). The upper face of the substrate 200 subjected to the pure water process is in a state entirely covered with pure water.

Thereafter, the substrate 200 covered with pure water is transferred from the acid/pure water processing unit 515 to the alkali/pure water processing unit 516 by a transfer device of the substrate conveyer 512. Then, in the alkali/pure water processing unit 516, an alkali process is performed, and a pure water process is continuously further performed (step S114). The upper face of the substrate 200 subjected to the pure water process is in a state entirely covered with pure water.

Then, the substrate 200 covered with pure water is transferred from the alkali/pure water processing unit 516 to the substrate reversing unit 513 by a transfer device of the substrate conveyer 512. Then, the upper and lower faces of the substrate 200 are reversed by the substrate reversing unit 513 (step S115). Specifically, the substrate 200 is reversed into a state where the frontside of the substrate 200 is on the upper side. Consequently, the upper face of the substrate 200 becomes the frontside.

Thereafter, the substrate 200 is transferred from the substrate reversing unit 513 to the acid/pure water processing unit 515 by a transfer device of the substrate conveyer 512. Then, in the acid/pure water processing unit 515, an acid process is performed to the frontside of the substrate 200, and a pure water process is continuously further performed thereto (step S116). The upper face of the substrate 200 subjected to the pure water process is in a state entirely covered with pure water.

Then, the substrate 200 is transferred from the acid/pure water processing unit 515 to the alkali/pure water processing unit 516 by a transfer device of the substrate conveyer 512. Then, in the alkali/pure water processing unit 516, an alkali process is performed to the frontside of the substrate 200, and a pure water process is continuously further performed thereto (step S117). At this time, the frontside that is now the upper face of the substrate 200 is dried.

Thereafter, the substrate 200 is transferred from the alkali/pure water processing unit 516 to the freezing unit 517 by a transfer device of the substrate conveyer 512. Then, in the freezing unit 517, the freezing process is performed to the frontside of the substrate 200 (step S118). The frontside of the substrate 200 is dried in the freezing process.

Thereafter, the substrate 200 is transferred from the freezing unit 517 to the loader/unloader 511 by a transfer device of the substrate conveyer 512. Then, the substrate 200 is unloaded from the substrate processing system 500 through the loader/unloader 511. As a result, the substrate processing method ends.

FIG. 21 is a flowchart illustrating another example of the processing sequence of a substrate processing method according to the fourth embodiment, in a case where there is no risk that a pattern arrangement face could be contaminated. In the flowchart of FIG. 21, as compared with that of FIG. 20, the alkali/pure water process to the frontside in step S117 is omitted, and a heat treatment is performed to the upper face that is the frontside of the substrate 200 here, in the heat treatment unit 519 (step S121), after the freezing process of step S118.

The other steps are substantially the same as those described with reference to FIG. 20, and thus their description will be omitted. Further, FIGS. 20 and 21 illustrate mere examples. There are different types of variations in the substrate processing method, depending on the employed cleaning process, as described with reference to FIG. 19.

In the fourth embodiment, the substrate 200 is transferred in a state where the upper face of the substrate 200 is entirely covered with pure water, between the acid/pure water processing unit 515, the alkali/pure water processing unit 516, and the freezing unit 517. Consequently, when the substrate 200 is transferred between respective units used for cleaning, the substrate 200 can prevent impurities from attaching thereto.

Where the probability of impurity attachment to the frontside of a substrate 200 is low in cleaning, the backside of the substrate 200 is first cleaned, and the frontside is then cleaned. On the other hand, where the probability of impurity attachment to the frontside of a substrate 200 is high in cleaning, the frontside of the substrate 200 is first cleaned, the backside is then cleaned, and, thereafter, the frontside is cleaned again. In this way, depending on the level of handling impurities in units used for cleaning, a change is made to the number of times of cleaning to be performed to the frontside and backside of a substrate 200. Accordingly, where the probability of impurity attachment to the frontside of a substrate 200 is low in cleaning, the number of times of cleaning to be performed to the substrate 200 can be reduced, and thus the manufacturing cost of semiconductor devices can be lowered.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A substrate processing apparatus comprising:
a substrate holder configured to hold a substrate including a first face;
a liquid supply section configured to supply a liquid onto the first face;
a cooling medium supply section configured to solidify the liquid supplied on the first face;
a monitor configured to monitor an optical characteristic or acoustic wave characteristic of a solidified layer formed by solidification of the liquid on the first face; and
a controller configured to control a cooling parameter, on a basis of a state of the solidified layer monitored, and to control start of melting the solidified layer in accordance with timing control for start of melting the solidified layer,
wherein the controller is configured to use a time point when it is detected that reflected light intensity, transmitted light intensity, or acoustic wave intensity of the solidified layer has become smaller than a determination threshold, after formation of the solidified layer, as a timing for starting the melting of the solidified layer.

2. The substrate processing apparatus according to claim 1, wherein the controller is configured to change the parameter, when a change in the optical characteristic or acoustic wave characteristic of the solidified layer is detected.

3. The substrate processing apparatus according to claim 2, wherein the parameter is a length of a processing time for cooling the substrate.

4. The substrate processing apparatus according to claim 3, wherein the controller is configured to use a time point when a change in the optical characteristic or acoustic wave characteristic of the solidified layer is detected, as a timing for stopping the cooling of the substrate by the cooling medium supply section and starting the melting of the solidified layer.

5. A substrate processing apparatus comprising:
a substrate holder configured to hold a substrate including a first face;
a liquid supply section configured to supply a liquid onto the first face;
a cooling medium supply section configured to solidify the liquid supplied on the first face;
a monitor configured to monitor an optical characteristic or acoustic wave characteristic of a solidified layer formed by solidification of the liquid on the first face; and
a controller configured to control a cooling parameter, on a basis of a state of the solidified layer monitored, and to control start of melting the solidified layer in accordance with timing control for start of melting the solidified layer, wherein the controller is configured to obtain a lapse of a processing time since start of the cooling the substrate, determine whether the first face of the substrate includes a pattern having a risk of collapse to be caused by brittle fracture of the solidified layer, and use a time point when a predetermined time has elapsed in the processing time, as a timing for starting the melting of the solidified layer, regardless of a state of the solidified layer monitored, when the first face does not include a pattern having the risk of collapse.

* * * * *